(12) United States Patent
Ukita

(10) Patent No.: US 7,963,691 B2
(45) Date of Patent: Jun. 21, 2011

(54) LIGHT PRESSURE ROTATOR AND LIGHT PRESSURE ROTATING DEVICE

(75) Inventor: Hiroo Ukita, Shiga (JP)

(73) Assignee: The Ritsumeikan Trust, Kyoto-Shi (JP)

( * ) Notice: Subject to any disclaimer, the term of this patent is extended or adjusted under 35 U.S.C. 154(b) by 980 days.

(21) Appl. No.: 11/632,962

(22) PCT Filed: Jul. 21, 2005

(86) PCT No.: PCT/JP2005/013411
§ 371 (c)(1),
(2), (4) Date: Jan. 19, 2007

(87) PCT Pub. No.: WO2006/009216
PCT Pub. Date: Jan. 26, 2006

(65) Prior Publication Data
US 2008/0031088 A1    Feb. 7, 2008

(30) Foreign Application Priority Data

Jul. 22, 2004  (JP) .............................. P2004-214150

(51) Int. Cl.
*B01F 7/18*    (2006.01)
(52) U.S. Cl. .................................................. 366/325.1
(58) Field of Classification Search ............... 366/325.1, 366/325.92, 330.1–330.7
See application file for complete search history.

(56) References Cited

U.S. PATENT DOCUMENTS 5,815,181 A * 9/1998 Kashino et al. ................. 347/65

FOREIGN PATENT DOCUMENTS

| JP | 54-35381 | 3/1979 |
|---|---|---|
| JP | 6-148560 | 5/1994 |
| JP | 6-213139 | 8/1994 |
| JP | 8-47274 | 2/1996 |
| JP | 9-170590 | 6/1997 |
| JP | 10-70890 | 3/1998 |
| JP | 2004-17203 | 1/2004 |

OTHER PUBLICATIONS

Machine Translation of JP 6-148560, Ukita et al.*
Machine Translation of JP 8-047274, Takeshi, Matsumoto.*

* cited by examiner

*Primary Examiner* — Walter D Griffin
*Assistant Examiner* — Timothy Cleveland
(74) *Attorney, Agent, or Firm* — Kratz, Quintos & Hanson, LLP

(57) ABSTRACT

The light pressure rotator (1) is the light pressure rotator being light pressure trapped by irradiation with light and light pressure rotating about the central axis O of rotation, characterized in that a reverse torque generating section generating a torque for rotating the rotator in the direction reverse to the predetermined direction is removed from a section arranged with three blades (2) each having a first side face (3) extending in the radial direction from the central axis O of rotation, a second side face (4) facing the central axis O of rotation, a third side face (5) facing the first side face (3), a lower surface (6) intersecting the central axis O of the rotation, and an upper surface (7) facing the lower surface (6). The light pressure rotating device comprises the light pressure rotator (1), a light source (C), and an objective (condenser) lens D.

11 Claims, 27 Drawing Sheets

| 1 | LIGHT PRESSURE ROTATOR | 5 | THIRD SIDE FACE |
| 2 | BLADE | 6 | LOWER SURFACE |
| 3 | FIRST SIDE FACE | 7 | UPPER SURFACE |
| 4 | SECOND SIDE FACE | 0 | CENTRAL AXIS OF ROTATION |

| | | | |
|---|---|---|---|
| 1 | LIGHT PRESSURE ROTATOR | 5 | THIRD SIDE FACE |
| 2 | BLADE | 6 | LOWER SURFACE |
| 3 | FIRST SIDE FACE | 7 | UPPER SURFACE |
| 4 | SECOND SIDE FACE | 0 | CENTRAL AXIS OF ROTATION |

26 LIGHT PRESSURE ROTATOR
27 LIGHT PRESSURE GENERATING INCLINED SURFACE
28 BLADE (a)   (b)

30 LIGHT PRESSURE ROTATOR
31 LIGHT PRESSURE GENERATING CURVED SURFACE
32 BLADE

34 LIGHT PRESSURE ROTATOR
35 LIGHT PRESSURE GENERATING INCLINED SURFACE
36 BLADE

38 LIGHT PRESSURE ROTATOR
39 LIGHT PRESSURE GENERATING CURVED SURFACE
40 BLADE (b)
45 LIGHT PRESSURE ROTATOR
46 REFLECTIVE FILM (a)
42 LIGHT PRESSURE ROTATOR
43 REFLECTIVE FILM

48 LIGHT PRESSURE ROTATOR
49 STIRRING PADDLE
50 LIGHT PRESSURE GENERATING INCLINED SURFACE

LIGHT PRESSURE ROTATOR AND LIGHT PRESSURE ROTATING DEVICE

TECHNICAL FIELD

The present invention relates to light pressure rotating bodies and light pressure rotating devices used in stirring micro-fluid and the like, more specifically, to a light pressure rotator and a light pressure rotating device that rotates with the light pressure generated by irradiation of light as driving source.

BACKGROUND ART

Conventionally, a mixer of a type in which magnetized stirring rotator is arranged at the bottom of a container accommodating liquid, and the stirring rotator is rotated by the rotatably driven magnet to stir the liquid is known for stirring the micro-fluid and so on (see e.g., patent document 1). However, such conventional mixer of the type driven by magnets will become impossible to use since the dimension of the microscopic flow path of an integrated chemical analysis equipment (micro-analysis chip) for mixing and reacting a very small amount of test solution and reagent to perform analysis is assumed to have a width of a few dozen μm and a depth of a few dozen μm in the future.

Therefore, research and development of a mixer of micro-fluid using micro-machining has been actively performed, and two methods of (1) a method of enhancing the mixing efficiency by converting the two liquids (test solution and reagent) to be mixed to a multi-layered flow by devising the number and shape of flow inlets, (2) a method of forming a groove in a flow path wall surface and generating turbulent flow, and (3) a method of vibrating a diaphragm (thin film) with PZT (lead zirconium titanate) and mixing the microscopic fluid thereon are mainly proposed. Comparing the three methods, the active method (3) more efficiently mixes the two liquids compared to the passive methods (1) and (2), but the two liquids may not necessarily be mixed at satisfactory efficiency since none of the methods regards directly stirring the two liquids.

In view of such aspect, a light pressure rotator has been proposed by the inventors of the present invention for directly mixing the micro-fluid (see patent document 2). The light pressure rotator disclosed in patent document 2 is a rotator being trapped by a so-called light pressure generated, when the change in momentum in refraction and reflection of light such as laser light is transformed as dynamic momentum to the microscopic object having light transmissivity, in a direction perpendicular to the surface thereof, and being light pressure rotated with the central axis of rotation as the center. The light pressure rotator is expected to be applied to optical micro-motor, optical micro-drill and the like, and can be used as an optical mixer for stirring the surrounding medium in time of light pressure rotation by arranging a plurality of blades on the side of the central axis of rotation.

Patent document 1: Japanese Laid-Open Patent Publication No. 10-192680

Patent document 2: Japanese Patent No. 3364780

DISCLOSURE OF THE INVENTION

However, when the light pressure rotator arranged with a plurality of blades as described above is arranged in the medium consisting of liquid, the viscosity resistance received by the surrounding medium in time of light pressure rotation is large and thus the light pressure rotating speed has limitations. Furthermore, since a very small amount of test solution and reagent are mixed and reacted to perform analysis in the integrated chemical analysis equipment, the micro-fluid must be stirred and mixed at satisfactory efficiency at a short as possible time in terms of measuring time and the like.

The present invention, in view of the above problems, aims to provide a light pressure rotator arranged with a plurality of blades on the side and being light pressure rotated about the central axis of rotation by irradiation of light such as laser light, which light pressure rotator stirs and mixes the surrounding micro-fluid more efficiently and more strongly, and a light pressure rotating device.

The present invention further aims to provide a light pressure rotating device in which an attachment tool is arranged at the central axis of rotation of the light pressure rotator being light pressure rotated about the central axis of rotation by irradiation of light such as laser light and the rotation of the light pressure rotator is effectively used.

In order to achieve the above aim, the light pressure rotator of claim 1 is a light pressure rotator being light pressure trapped by irradiation with light and light pressure rotated when applied with a torque to rotate in a predetermined direction about a central axis of rotation; where a reverse torque generating section generating a torque for rotating in the direction reverse to the predetermined direction is removed from a section arranged with three blades each having a first side face extending in the radial direction from the central axis of rotation, a second side face facing the central axis of rotation, a third side face facing the first side face, a lower surface intersecting the central axis of rotation, and an upper surface facing the lower surface.

The light pressure rotator of claim 2 has features in that the reverse torque generating section is a section where a predetermined region of the third side face facing the first side face of another blade in the light pressure rotational direction is removed from a section where a plane including the central axis of rotation and the third side face are orthogonal to each other.

The light pressure rotator of claim 3 is a light pressure rotator being light pressure trapped by irradiation with light and light pressure rotated when applied with a torque to rotate in a predetermined direction about a central axis of rotation; where two or more blades, each having a first side face extending in the radial direction from the central axis of rotation, a second side face facing the central axis of rotation, a third side face facing the first side face and having the radial direction inclined at a predetermined angle in the light pressure rotational direction with respect to a plane parallel to the first side face, a lower surface intersecting the central axis of rotation, and an upper surface facing the lower surface, are radially arranged at equidistance with the central axis of rotation as the center.

The light pressure rotator of claim 4 is a light pressure rotator being light pressure trapped by irradiation with light and light pressure rotated when applied with a torque to rotate in a predetermined direction about a central axis of rotation; where two or more blades, each having a first side face extending in the radial direction from the central axis of rotation, a second side face facing the central axis of rotation, a third side face facing the first side face and having a lateral cross sectional shape curved to the first side face side, a lower surface intersecting the central axis of rotation, and an upper surface facing the lower surface, are radially arranged at equidistance with the central axis of rotation as the center.

The light pressure rotator of claim 5 has features in that the lateral cross sectional shape curved to the first side face side is a curved lateral cross sectional shape in which the angle formed by the radial direction passing through the central axis of rotation and the light pressure direction is a right angle.

The light pressure rotator of claim 6 is a light pressure rotator being light pressure trapped by irradiation with light and light pressure rotated when applied with a torque to rotate in a predetermined direction about a central axis of rotation; where two or more blades, each having a first side face extending in the radial direction from the central axis of rotation, a second side face facing the central axis of rotation, a third side face facing the first side face, a lower surface intersecting the central axis of rotation, and a light pressure generating inclined surface facing the lower surface and inclined towards the lower surface side from the first side face to the third side face, are radially arranged at equidistance with the central axis of rotation as the center.

The light pressure rotator of claim 7 is a light pressure rotator being light pressure trapped by irradiation with light and light pressure rotated when applied with a torque to rotate in a predetermined direction about a central axis of rotation; where two or more blades, each having a first side face extending in the radial direction from the central axis of rotation, a second side face facing the central axis of rotation, a lower surface intersecting the central axis of rotation, and a light pressure generating inclined surface inclined downward from the first side face to the lower surface, are radially arranged at equidistance with the central axis of rotation as the center.

The light pressure rotator of claim 8 has features in that the light pressure generating inclined surface has a curved surface shape in which the angle formed by a radial direction passing through the central axis of rotation and a light pressure direction is a right angle.

The light pressure rotator of claim 9 has features in that a reflective film is attached to the light pressure generating inclined surface so that the irradiated light does not enter inside the light pressure rotator.

The light pressure rotator of claim 10 is a light pressure rotator being light pressure trapped by irradiation with light and light pressure rotated when applied with a torque to rotate in a predetermined direction about a central axis of rotation; where two or more stirring paddles are radially arranged in from the central axis of center of the main body of the light pressure rotator; and a plurality of light pressure generating inclined surfaces intersecting each other at the central axis of rotation are formed on the upper surface, the lower surface or both surfaces of the main body of the light pressure rotator.

The light pressure rotator of claim 11 has features in that the material of the light pressure rotator is dielectric material, PMMA or resist having high transmissivity (low absorption).

The light pressure rotator of claim 12 has features in that the light pressure rotator is formed through pressing or injecting molding using a mold.

The light pressure rotating device of claim 13 is a light pressure rotating device characterized by comprising the light pressure rotator according to any one of claims 1 to 11, and an artificial light source for irradiating light to the light pressure rotator.

The light pressure rotating device of claim 14 has features in that an objective lens is interposed between the artificial light source and the light pressure rotator, and the light from the artificial light source is condensed and irradiated to a predetermined focal position to move the light pressure rotator to the vicinity of the focal position and rotatably drive the light pressure rotator at the moved position.

The light pressure rotating device of claim 15 has features in that the objective lens freely moves closer to or moves away with respect to the artificial light source.

The light pressure rotating device of claim 16 has features in that the artificial light source and the objective lens are freely movable in the three dimensional direction.

The light pressure rotating device of claim 17 has features in that the artificial light source is a laser light source.

The light pressure rotating device of claim 20 has features in that an attachment tool is arranged on the central axis of rotation of the main body of the light pressure rotator.

The light pressure rotating device of claim 21 has features in that the attachment tool is a take-up tool for an ultra thin string.

The light pressure rotating device of claim 31 includes an artificial light source and a light pressure rotator rotated by the light from the artificial light source; and is a take-up tool for taking up the ultra thin string around the light pressure rotator.

EFFECTS OF THE INVENTION

According to the light pressure rotator of claim 1, the light pressure rotator is light pressure trapped near the focus of the condensing irradiated light and is light pressure rotated about the central axis of rotation by condensing irradiating the light from above the upper surface. Since the reverse torque generating section is removed, faster light pressure rotation is achieved compared to the light pressure rotator not removed with the relevant section. Therefore, when the rotator is light pressure rotated in the medium such as micro-fluid, the surrounding micro-fluid is more efficiently stirred and mixed, and the rotary force of the light pressure rotator is increased.

According to the light pressure rotator of claim 2, the reverse torque generating section is a predetermined region on the central axis of rotation side of the third side face and the relevant section is removed, whereby the material cost is reduced by the removed section. The rotary force is increased by the reduced amount of the entire weight.

According to the light pressure rotator of claim 3, the light pressure rotator is light pressure trapped near the focus of the condensing irradiated light and is light pressure rotated about the central axis of rotation by condensing irradiating the light from above the upper surface. Furthermore, since the third side face is inclined at a predetermined angle with respect to the first side face, the total amount of optical torque generated from the third side face increases compared to the light pressure rotator in which the third side face is formed parallel to the first side face, and thus the rotator can be light pressure rotated faster.

According to the light pressure rotator of claim 4, the light pressure rotator is light pressure trapped near the focus of the condensing irradiated light and is light pressure rotated about the central axis of rotation by condensing irradiating the light from above the upper surface. Furthermore, since the third side face is formed into a curved surface shape, the total amount of optical torque generated from the third side face increases compared to the light pressure rotator in which the third side face is formed into a planar shape, and as a result, the rotator can be light pressure rotated faster.

According to the light pressure rotator of claim 5, the angle formed by the radial direction passing through the central axis of rotation and the light pressure direction is a right angle, and thus the rotator can be light pressure rotated at the highest speed.

According to the light pressure rotator of claim 6, since the light pressure generating inclined surface facing the lower surface and inclined towards the lower surface side from the first side face to the third side face is formed, the light pressure rotator can be light pressure rotated by parallel irradiated light. The objective lens for condensing the light is thus unnecessary, and the light pressure rotator device of the integrated chemical analysis equipment and the like is simplified.

According to the light pressure rotator of claim 7, since the light pressure generating inclined surface inclined downward from the first side face towards the lower surface is formed, the light pressure rotator is light pressure rotated by the parallel irradiated light. Thus, the objective lens for condensing the light is unnecessary, and the configuration of light pressure rotator device of the integrated chemical analysis and the like is simplified. Furthermore, since the third side face is not formed, the light pressure generating area, that is, the reverse torque generating area at the first side face is reduced compared to the light pressure rotator in which the third side face is formed. Therefore, faster light pressure rotation is achieved compared to the light pressure rotator in which the third side face is formed.

According to the light pressure rotator of claim 8, since the third side face is formed to the curved surface shape in which the angle formed by the radial direction passing through the central axis of rotation and the light pressure direction is at right angles, the total amount of optical torque generated from the third side face becomes a maximum, and faster light pressure rotation is achieved compared to the light pressure rotator in which the third side face is planar or the light pressure rotator in which the third side face is simply formed to a curved surface.

According to the light pressure rotator of claim 9, since the irradiated laser light does not enter inside the light pressure rotator as the reflective film is attached, the reverse torque inhibiting the light pressure rotation is prevented from generating from the first side face. Therefore, faster light pressure rotation is achieved compared to the light pressure rotator in which the reflective film is not attached to the light pressure generating inclined surface. This light pressure rotator rotates in the reverse direction compared to that in which the reflective film is not arranged.

According to the light pressure rotator of claim 10, since a plurality of light pressure generating inclined surfaces crossing at the central axis of rotation are formed at the upper surface or at the lower surface of the main body of the light pressure rotator arranged with two or more stirring paddles, the light pressure rotator can be light pressure rotated by the parallel irradiated light. Thus, the objective lens for condensing the light is unnecessary, and the configuration of the light pressure rotator device of the integrated chemical analysis equipment and the like is simplified.

According to the light pressure rotator of claim 11, the light pressure rotator can be easily manufactured by dielectric, PMMA or resist having light transmissivity.

According to the light pressure rotator of claim 12, the light pressure rotator of the same shape is inexpensively mass produced since the molding thereof is performed through pressing or injection molding using a mold.

According to the light pressure rotating device of claim 13, the light pressure rotator is rotated using the light from an artificial light source as the rotational energy for providing rotary torque, and thus may be used in places where natural light cannot be reached or at night. The light source that can strongly generate the rotary torque by the property of the artificial light source is selected.

According to the light pressure rotating device of claim 14, since the parallel light is condensed to a focus by an objective lens and irradiated, the light pressure rotator can be light trapped in the vicinity of the light condensed focus and be drawn thereto. The light pressure rotator can be rotated with condensed and irradiated light.

According to the light pressure rotating device of claim 15, since the objective lens can move closer to or move away from the artificial light source, the light pressure rotator can be freely moved in the medium in the direction of moving away or moving closer to the objective lens while being rotated.

According to the light pressure rotating device of claim 16, since the artificial light source and the objective lens are freely movable in the three dimensional direction, the light pressure rotator is also freely movable in the three dimensional direction in the medium while being rotated.

According to the light pressure rotating device of claim 17, since the laser light source is used as the artificial light source, the wavelengths are lined and condensing property is satisfactory, and thus the energy per unit area is high. The laser light source (laser emitter) has wide variety of types and is relatively easy to acquire at low cost.

According to the light pressure rotating device of claim 20, an attachment tool is arranged on the center of rotation, and thus the light pressure rotating device can be applied to various applications since the attachment tool rotates with the light pressure rotator and moves in the three dimensional direction as necessary.

According to the light pressure rotating device of claim 21, since the attachment tool is a take-up tool for an ultra thin string, the relevant device is effectively used as a take-up tool for the microscopic string of DNA. The shape of the take-up tool may be of various shapes such as columnar shape, rectangular cylinder shape, disc shape, pulley shape etc.

According to the light pressure rotating device of claim 31, the device is simplified since the ultra thin string such as DNA is taken up around the light pressure rotator itself.

DESCRIPTION OF SYMBOLS 1, 18, 22, 26, 30, 34, 38, 42, 45, 48, 101 LIGHT PRESSURE ROTATOR
2, 20, 24, 28, 32, 36, 40 BLADE
3 FIRST SIDE FACE
4 SECOND SIDE FACE
5, 19, 23 THIRD SIDE FACE
6 LOWER SURFACE
7 UPPER SURFACE
10 REVERSE TORQUE GENERATING SECTION (PREDETERMINED REGION)
27, 35, 50 LIGHT PRESSURE GENERATING INCLINED SURFACE
31, 39 LIGHT PRESSURE GENERATING CURVED SURFACE (LIGHT PRESSURE GENERATING INCLINED SURFACE)
43, 46 REFLECTIVE FILM
49 STIRRING PADDLE
A PREDETERMINED ANGLE
C LASER LIGHT SOURCE (LASER EMITTER)
D OBJECTIVE (CONDENSER) LENS
O CENTRAL AXIS OF ROTATION
F LIGHT PRESSURE
60 ATTACHMENT TOOL
61 TAKE-UP TOOL
62 DRILL
63 POINTED OBJECT
64 ROTATING SHAFT
65 STIRRING BLADE
66 HAMMER
67 HEMISPHERE
68 BRUSH
69 PROPELLER
70 ROTATING BLADE

BEST MODE FOR CARRYING OUT THE INVENTION

Figure 1:
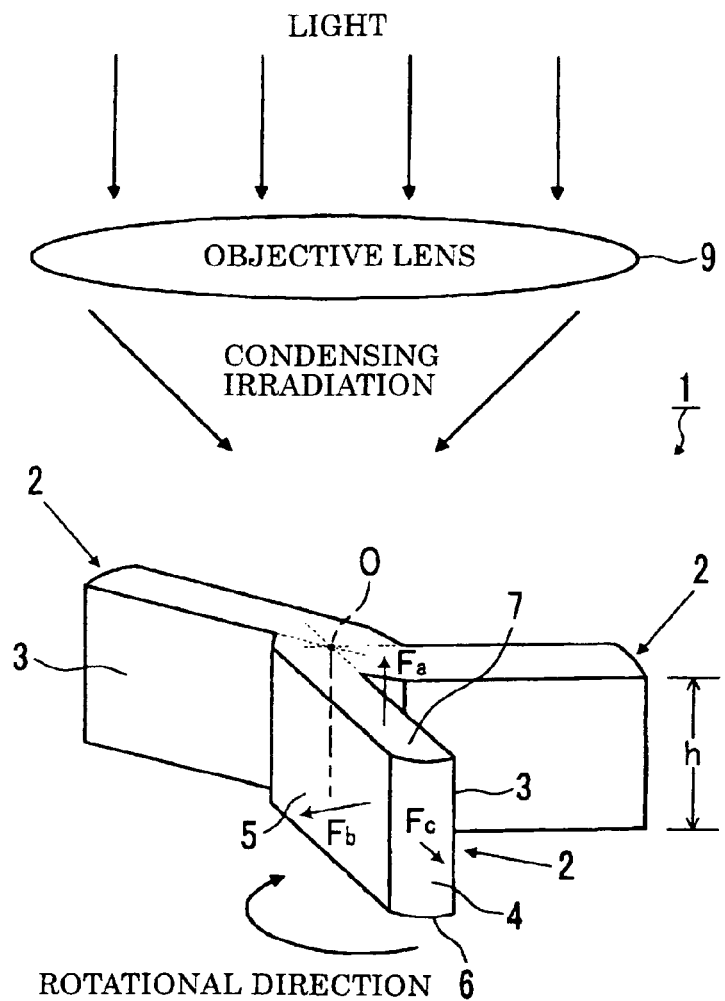
FIG. 1 is a perspective view showing a light pressure rotator according to a first embodiment of the present invention.
Figure 2:
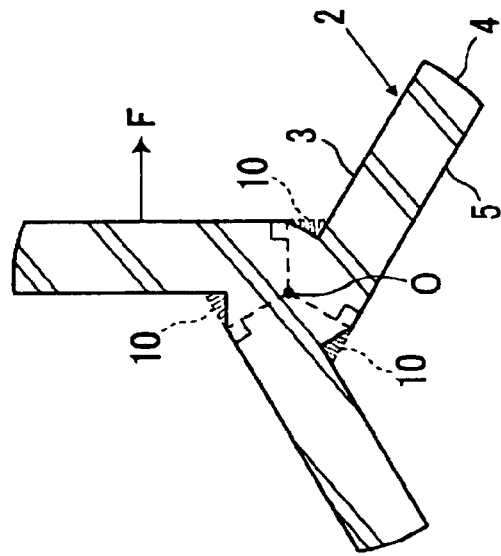
FIG. 2(a) is a cross sectional view taken in the horizontal direction of the light pressure rotator.
FIG. 2(b) is a cross sectional explanatory view showing a reverse torque generating section of the light pressure rotator.
Figure 2:
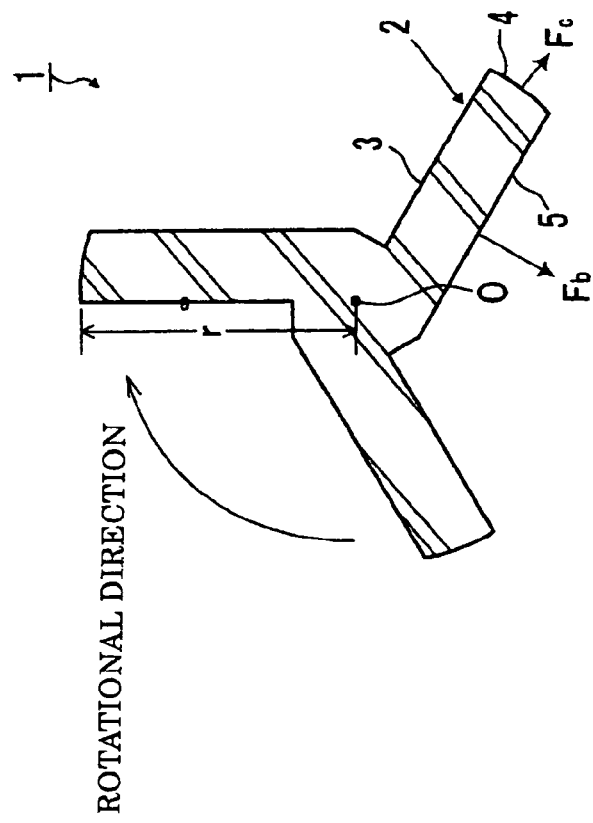

The light pressure rotator according to the embodiment of the present invention will now be described based on the figures. FIGS. 1 and 2 are views illustrating the light pressure rotator 1 effectively used in the optical mixer and the like according to the first embodiment of the present invention. The high pressure rotating body 1 is a light pressure rotator being light pressure trapped by the light pressure generated by irradiation of light such as laser light and light pressure rotated about the central axis O of rotation, and is manufactured by micro-machine technique. The light pressure is the force generated, when the change in momentum in refraction and reflection of light is transformed as dynamic momentum to the microscopic object having light transmissivity, in the direction perpendicular to the surface. Therefore, the light pressure rotator 1 simply needs to have light transmissivity, and dielectric material such as transparent glass, organic substance such as PMMA (polymethyl methacrylate) and resist may be used for the material thereof.

As shown in the figure, the light pressure rotator 1 is configured by arranging three blades 2 about the central axis O of rotation. Each blade 2 includes a first side face 3 extending in the radial direction from the central axis O of rotation, a second side face 4 facing the central axis O of rotation, a third surface 5 facing the first side face 3, a lower surface 6 intersecting the central axis O of rotation, and an upper surface 7 facing the lower surface 6, all of which being arranged so as to face the same direction about the central axis O of rotation. In the present embodiment, all the surfaces are formed as flat surfaces, and the first side face 3 and the third side face 5 as well as the upper surface 7 and the lower surface 6 are formed parallel to each other. The second side face 4 is herein formed as one part of a circumference, that is, as a curved surface having the central axis O of rotation as the center to light pressure rotate the light pressure rotator 1 at higher speed, but does not need to be a curved surface and may be a flat surface if the rotating speed can be lowered. The second surface 4 is formed into a curved surface to have the optical torque at the relevant surface as zero and to reduce the friction resistance between the blade 2 and the fluid medium such as surrounding liquid.

FIG. 2(a) is a cross sectional view taken in the horizontal direction of the light pressure rotator 1 shown in FIG. 1. The light pressure rotator 1 is manufactured so that the radius r in the radial direction of the central axis O of rotation is between a few μm and a few dozen μm. The radius r is not particularly limited and is appropriately designed and changed according to the usage application of the light pressure rotator 1, and thus the light pressure rotator 1 having the radius r of between a few μm and a few dozen μm may be formed through micromachine technique and the like. The light pressure rotator 1 is drawn closer to the vicinity of the position where the light passing through the objective lens 9 is condensed and irradiated to a predetermined focus and is light pressure rotated in the direction indicated by an arrow in FIG. 2(a) by the light pressure generated by condensing irradiation, where light pressure rotator is designed so that the height h (linear distance between upper surface 7 and lower surface 6) and the radius r shown in FIG. 1 are substantially equal to enable stable light pressure rotating, but the relationship between the height h and the radius r is not limited thereto as long as the light pressure rotator 1 is rotatable in the direction of the arrow shown in the figure. Since the light pressure rotator 1 is drawn closer to the vicinity of the position where light is condensed to the focus of the objective lens 9, as described above, the position at where the light pressure rotator 1 rotates is determined by the position or the focal length of the objective lens 9.

The principle of operation of the light pressure rotator 1 of when the light is condensed and irradiated will now be described based on FIGS. 1 and 2(a).

Although not shown, the light pressure rotator 1 is arranged in the medium, which is liquid having a predetermined viscosity, and the light pressure rotator 1 is drawn closer to the vicinity of the focal position of the condensed light and the light is condensed and irradiated from slightly above the upper surface 7 of the light pressure rotator 1.

When the light is parallel irradiated from above in parallel to the central axis O of rotation, the parallel irradiated light is condensed by the objective lens 9, and the condensed light is irradiated onto the light pressure rotator 1. The light pressure $F_a$ in the direction perpendicular to the upper surface 7 is generated at the light incident point of the upper surface 7 of the light pressure rotator 1 (see FIG. 1).

The light pressure $F_a$ acts as the force of drawing the light pressure rotator 1 closer to the position of maximum light intensity, specifically, to the focal position of the condensed and irradiated light, or a so-called light pressure trapped (captured) force.

When the light refracted at the incident point of the upper surface 7 enters the light pressure rotator 1, the entered light exits from each side face, whereby light pressure F is generated in the direction perpendicular to the respective side face. That is, when the entered light exits from the third side face 5, the light pressure $F_b$ is generated in the direction perpendicular to the third side face 5. The light pressure $F_c$ is also generated from the second side face 4 in the direction perpendicular to the side face 4, but the optical torque is zero since it is perpendicular to the circumferential surface. The remaining first side face 3 is in plane with the central axis O of rotation, and thus the entered light does not exit from the first side face 3 and the light pressure F is not generated.

As described above, the light pressure $F_a$ in the direction perpendicular to the upper surface 7, the light pressure $F_c$ in the direction perpendicular to the second side face 4, and the light pressure $F_b$ in the direction perpendicular to the third side face 5 are generated at the blade 2 of the light pressure rotator 1. Since the light pressure rotator 1 is configured with three blades 2 of the same configuration arranged about the central axis O of rotation, the light pressure F is also generated from the other blades 2. Therefore, the light pressure rotator 1 is drawn upward by the light pressure $F_a$ generated in the direction perpendicular to the upper surface of each blade 2, and light pressure trapped near the focus (position slightly below the focus) of the condensing irradiated light, and furthermore, rotated (light pressure rotated) in the clockwise direction by the pressure $F_b$ generated in the direction perpendicular to the third side face 5 of each blade 2.

The light pressure rotator 1 shown in FIG. 2(a) is the light pressure rotator 1 with a reverse torque generating section 10 of the third side face 5 on the side of the first side face 3 of the other blade 2 in the light pressure rotating direction removed from the portion where the plane including the central axis O of rotation and the third side face 5 are orthogonal to each other in the light pressure rotator shown in FIG. 2(b). The reverse torque generating section 10 is a section where the reverse torque that inhibits the light pressure rotation of the light pressure rotator 1 is generated, and thus faster light pressure rotation becomes possible with the same amount of laser light irradiation by removing the relevant section. The principle of generating the reverse torque will now be described based on the optical torque generated by the light pressure F generated from the third side face 5. The optical torque generated by the light pressure F is expressed by the inner product of the distance vector from the center of rotation and the vector of the light pressure F.

Figure 3:
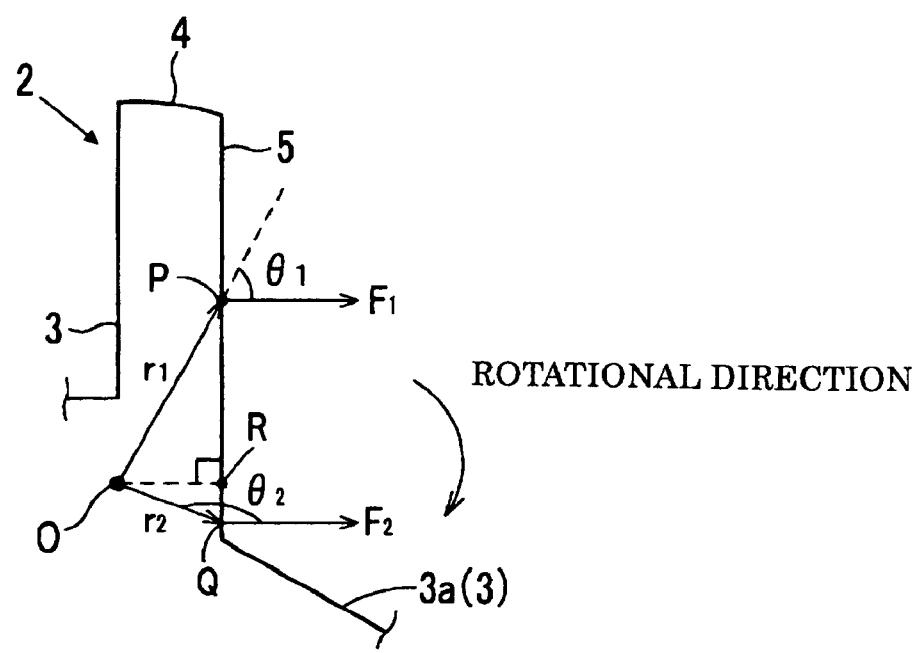
FIG. 3 is an explanatory view of the optical torque of a light pressure rotator according to the first embodiment.

FIG. 3 is a view for explaining the optical torque generated from the third side face 5 of the blade 2. The optical torque generated by the light pressure $F_1$ acting in the direction perpendicular to a certain point P on the third surface 5 is expressed by $r_1 F_1 \cos \theta_1$ with the distance vector from a point on the central axis O of rotation in plane with point P to point P as $r_1$. Since $0° < \theta_1 < 90°$ at point P shown in the figure, the optical torque expressed by the above equation becomes positive, and the optical torque acts in the rotational direction of the optical mixer 1. This point P exists between point R at where the perpendicular line dropped from the central axis O of rotation to the third side face 5 intersects and the distal end of the third side face 5.

The optical torque at point Q in the figure at where the light pressure F2 is generated is expressed by $r_2 F_2 \cos \theta_2$ with the distance vector from a point on the central axis O of rotation in plane with point Q to point Q as $r_2$. Since $90° < \theta_2 < 180°$ at point Q shown in the figure, the optical torque expressed by the above equation becomes negative. Therefore, this optical torque acts as a so-called reverse torque in the direction reverse to the rotational direction of the light pressure rotator 1. This point Q exists between point R and the intersection of the first side face 3 and the third side face 5.

From the above description, the region between the portion the plane including the central axis O of rotation and point R (broken line portion from O to point R in the figure) and the third side face 5 cross at right angles and the first side face 3a (3) of the other blade 2 on the light pressure rotational direction side is the reverse torque generating section 10. In other words, the reverse torque generating section is the section from the position of the foot of the perpendicular line (point R) dropped from the point on the central axis O of rotation to the third side face 5 to the first side face 3a of the adjacent blade 2 on the rotational direction side. Therefore, the generation of the optical torque is prevented in the direction reverse to the rotational direction by removing the reverse torque generating section 10, whereby the light pressure rotator 1 can be light pressure rotated at higher speed. With regards to the removing depth, the generation of the reverse torque is effectively prevented if the angle θ formed with the perpendicular line dropped from the central axis O of rotation on the side face removed in a direction parallel to the central axis of rotation is in the range of $0° < \theta < 90°$.

The perpendicular line dropped from a point on the central axis O of rotation to the third side face 5 intersects with the first side face 3 of the adjacent blade 2 in the light pressure rotator 1 arranged with four blades 2, and furthermore, the perpendicular line cannot be dropped from a point on the central axis O of rotation to the third side face 5 if the number of blades 2 is more than or equal to four. That is, the reverse torque generating section 10 exists only for the light pressure rotator 1 arranged with three blades 3.

Figure 4:
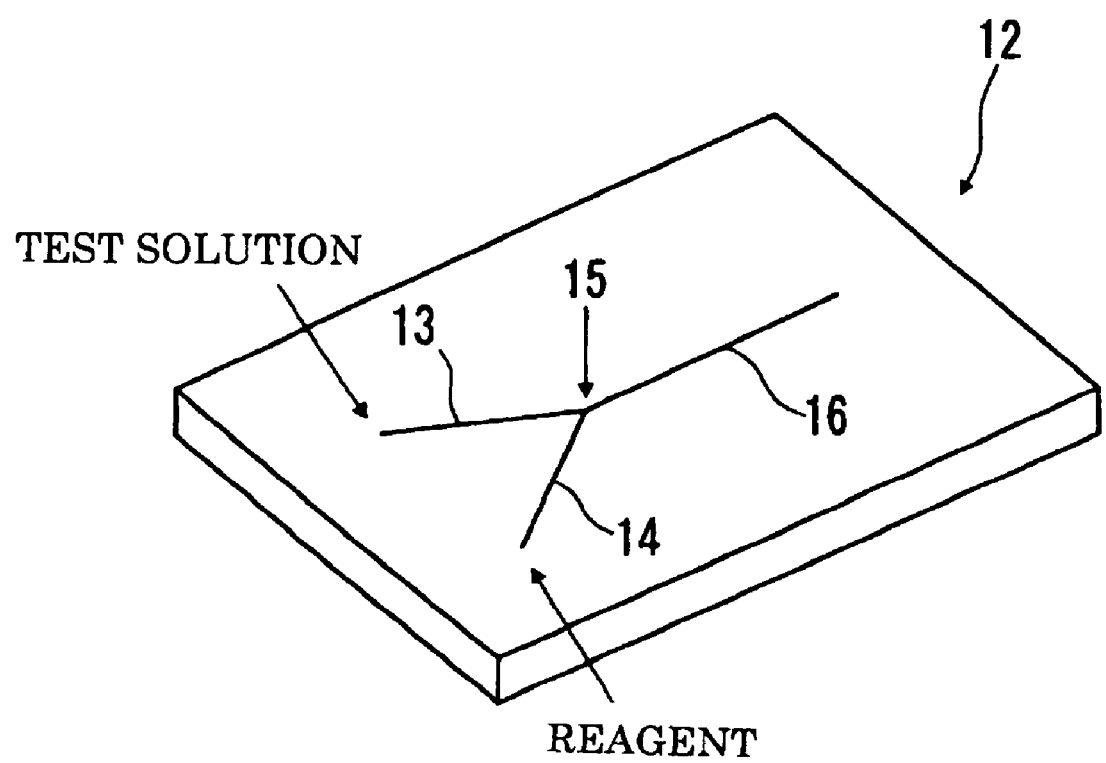
FIG. 4 is a perspective view schematically showing the microscopic flow path of the integrated chemical analysis equipment.

FIG. 4 is a perspective view schematically showing the microscopic flow path (microchannel) of the integrated chemical analysis equipment (micro-analysis chip) 12. The microscopic flow path of the integrated chemical analysis equipment 12 is configured by a microscopic flow path 13 where the micro-fluid such as test solution flows, a microscopic flow path 14 where other micro-fluid such as reagent flows, a mixing section 15 at where the microscopic flow paths 13 and 14 merge, and a microscopic flow path 16 where the mixed fluid mixed with two micro-fluids flows, as shown in the figure. The light pressure rotator 1 serving as the optical mixer is arranged at the mixing section 15 of the integrated chemical analysis equipment 12 configured as above, and the light is condensed and irradiated from above onto the light pressure rotator 1 using a light source (not shown), objective lens 9 etc., so that the light pressure rotator 1 is light pressure rotated at high-speed, and the two micro-fluids such as test solution and reagent are efficiently mixed and stirred at the mixing section 15. The dimension of the microscopic flow path is not particularly limited, but the dimension of the microscopic flow path at least at the mixing section 15 is formed to about a width of 100 μm and a depth of 100 μm since the light pressure rotator 1 is arranged thereat. The light pressure rotator 1 serving as the optical mixer can be further miniaturized to be smaller than the above dimension, in which case, the dimension of the microscopic flow path may obviously be formed to a width of about a few dozen μm and a depth of about a few dozen μm.

The light pressure rotator 1 is light pressure rotated about the central axis O of rotation by the light condensed and irradiated from above, and thus can be remotely driven. Since the light pressure rotator is light pressure rotated while being light pressure trapped in the vicinity of the focus of the condensing irradiated light, the bearing is unnecessary, and the light pressure rotator 1 can be light pressure rotated at an arbitrary location by moving only the position of the objective lens 9. The stirring efficiency is thus enhanced by light pressure rotating the light pressure rotator 1 at the location (interface of two micro-fluids) suited for stirring and mixing.

A light pressure rotator 18 according to a second embodiment of the present invention will now be described based on FIG. 5(*a*). The light pressure rotator 18 according to the present embodiment is a light pressure rotator being light pressure trapped by irradiation with light and light pressure rotated about the central axis O of rotation, and having two or more blades 20 radially arranged at equidistance with the central axis O of rotation as the center, each blade having a first side face 3 extending in the radial direction from the central axis O of rotation, a second side face 4 facing the central axis O of rotation, a third side face 19 facing the first side face 3 and having a plane and cross sectional shape in which the radial direction side (second side face 4 side) is inclined by a predetermined angle a in the direction of light pressure rotation (rotational direction) with respect to the plane parallel to the first side face 3, a lower surface 6 intersecting the central axis O of rotation, and an upper surface 7 facing the lower surface 6. The components denoted with the same reference characters as in the light pressure rotator 1 according to the first embodiment are similarly formed, and thus the description thereof will be omitted and the difference will be mainly described.

Figure 5:
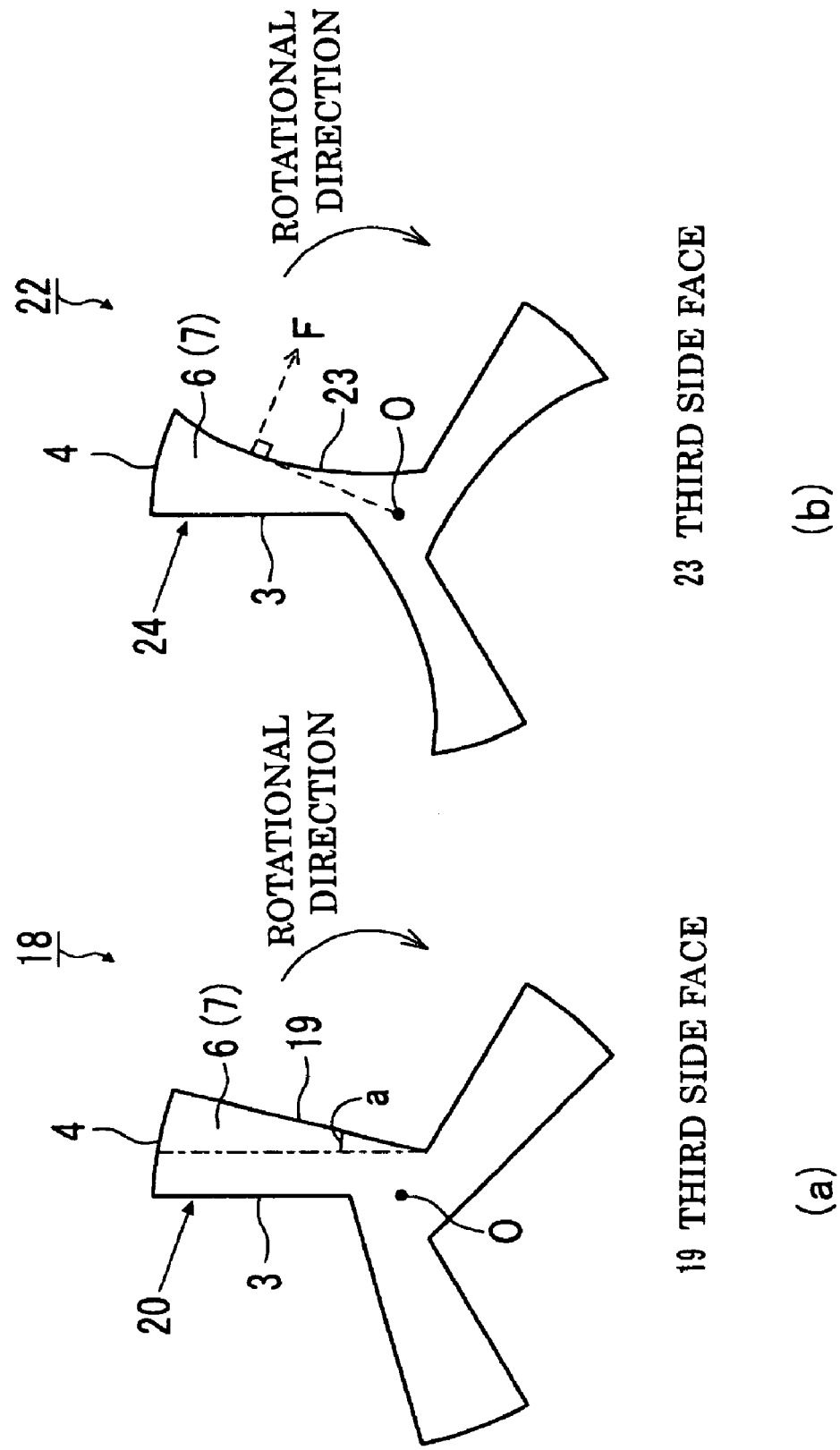
FIG. 5(a) is a plan view of a light pressure rotator according to a second embodiment or the present invention.
FIG. 5(b) is a plan view of a light pressure rotator according to a third embodiment of the present invention.

FIG. 5(*a*) is a plan view schematically showing the light pressure rotator 18 arranged with three blades 20, where the angle between the distance vector from a point on the central axis O of rotation to the third side face 19 and the light pressure vector acting on the one point becomes smaller by inclining the third side face 19 on the rotational direction side by a predetermined angle a compared to the first embodiment in which the third side face 19 is not inclined. In other words, the value of cos θ of the optical torque expressed by rF cos θ increases and the optical torque increases, and a faster light pressure rotation becomes possible compared to the light pressure rotator 1 in which the third side face 19 is parallel to the first side face 3.

The inclination angle a of the third side face 19 with respect to the plane parallel to the first side face 3 is not particularly limited but the light pressure rotator 18 that light pressure rotates at the fastest speed can be manufactured among the light pressure rotator 18 in which the third side face 19 is inclined by determining the predetermined angle a so that the total amount of optical torque generated from the third side face 19 becomes a maximum.

Therefore, the total amount of optical torque generated from the third side face 19 increases compared to the light pressure rotator 1 according to the first embodiment, and thus faster light pressure rotation is achieved since the light pressure rotator 18 according to the second embodiment of the present invention is formed with the third side face 19 inclined by a predetermined angle a in the direction about the central axis O of rotation with respect to the surface parallel to the first side face 3.

A light pressure rotator 22 according to a third embodiment of the present invention will now be described based on FIG. 5(*b*). The light pressure rotator 22 according to the present embodiment has three blades 24 radially arranged at equidistance with the central axis O of rotation as the center, each blade including a first side face 3 extending radially from the central axis O of rotation, a second side face 4 facing the central axis O of rotation, a third side face 23 facing the first side face 3 and having a cross sectional shape curved towards the first side face 3 side, a lower surface intersecting the central axis O of rotation, and an upper surface 7 facing the lower surface 6. The components denoted with the same reference numbers as in the light pressure rotator 1 according to the first embodiment are similarly formed as in the light pressure rotator 1, and thus the description thereof will be omitted and the difference will be mainly described. The number of blades 24 only needs to be two or more.

The light pressure rotator 22 shown in FIG. 5(*b*) has the curved surface shape formed into a curved surface shape so that the angle formed by the radial direction passing through the central axis O of rotation and the light pressure direction (direction perpendicular to the third side face 23 at the light exit point in the third side face 23) is a right angle. Therefore, the optical torque generated at each light exit point in the third side face 23 becomes a maximum, and the total amount of optical torque generated at the third side face 23 becomes a maximum out of the light pressure rotator in which the third side face 23 is merely formed into a curved surface shape.

Since the light pressure rotator 22 according to the third embodiment of the present invention has the third side face 23 formed into a curved surface shape so that the total amount of optical torque generated form the third side face 23 becomes a maximum, a faster light pressure rotation is achieved compared to the light pressure rotator 1 according to the first embodiment of the present invention.

Figure 13:
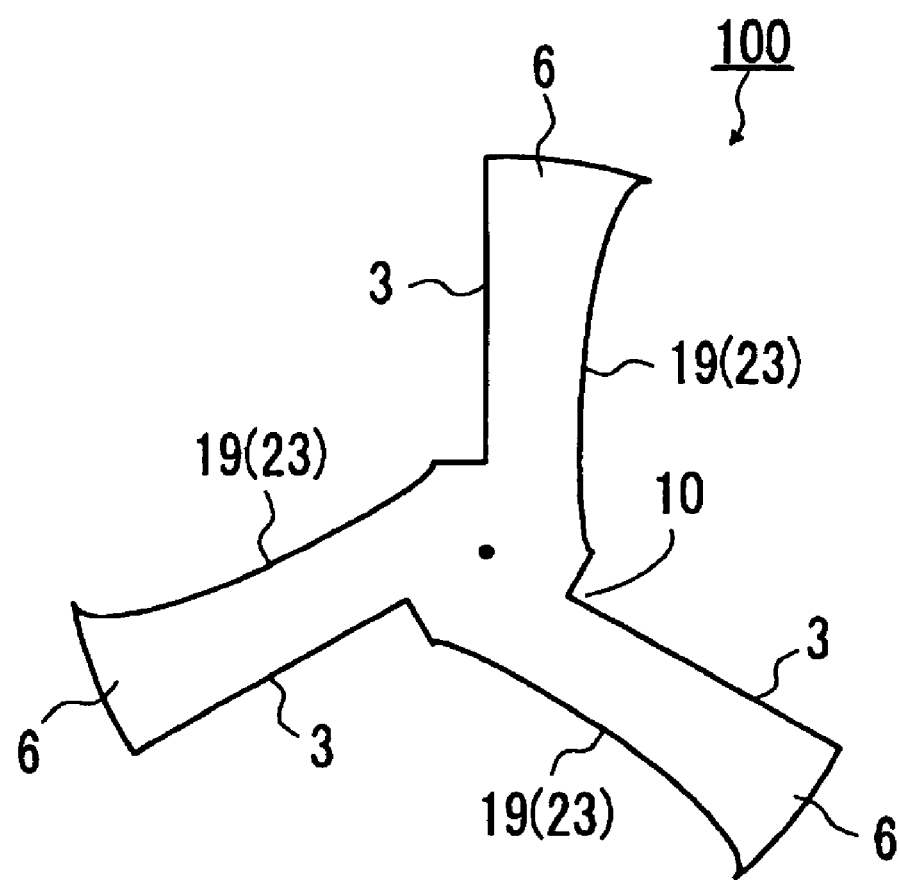
FIG. 13 is a plan view of a preferred light pressure rotator.

FIG. 13 shows the preferred light pressure rotator 100 in which strong rotary torque is obtained by having all of the above features. In the light pressure rotator 100, the reverse torque generating section 10 is removed, the third side face 19 (23) has the radial direction projecting towards the rotation side by angle a, and the third side face 23 (19) is a surface curved towards the first side face side.

A light pressure rotator 26 according to a fourth embodiment of the present invention will now be described based on FIG. 6. The light pressure rotator 26 is a light pressure rotator being light pressure trapped by irradiation with light and light pressure rotated about the central axis O of rotation, and having four blades 28 radially arranged at equidistance with the central axis O of rotation as the center, each blade including a first side face 3 extending in the radial direction from the central axis O of rotation, a second side face 4 facing the central axis O of rotation, a third side face 5 facing the first side face 3, a lower surface 6 intersecting the central axis O of rotation, and a light pressure generating inclined surface 27 facing the lower surface 6 and inclined downward from the first side face 3 towards the third side face 5. The light pressure generating inclined surface 27 is a plane formed so as to contact the first side face 3, the second side face 4, and the third side face 5, as shown in the figure. The number of blades 28 only needs to be two or more.

The principle of operation of the light pressure rotator 26 of when the light is parallel irradiated will now be described based on FIG. 7, where the components same as the light pressure rotator 1 according to the first embodiment are denoted with the same reference characters, and thus the description thereof will be omitted. FIG. 7(a) is a front view of the blade 28 seen from a direction indicated by an arrow A in FIG. 6, FIG. 7(B) is a top view of the blade 28 seen from above in a direction parallel to the central axis O of rotation. Although not shown, the light pressure rotator 26 is arranged in the fluid medium including liquid or gas.

When the light is parallel irradiated from above with respect to the central axis O of rotation from the light source (not shown), the light pressure F is generated in the direction perpendicular to the light pressure generating inclined surface 27 at the light incident point in the light pressure generating inclined surface 27 of the light pressure rotator 26, as shown in FIG. 7(a). The light pressure F can be resolved into the vertical direction component Fs and the horizontal direction component Fg. As shown in FIG. 7(b), the horizontal direction component Fg is further resolved into the rotational direction component Ft about the central axis O of rotation and the component Fr in the radial direction (radius direction) from the central axis O of rotation. The rotational direction component Ft acts as the rotary torque.

The light that has entered inside the light pressure rotator 26 from the light pressure generating inclined surface 27 is reflected at the first side face 3, reflected at the lower surface 6 and then exit. The light reflected at the lower surface 6 exits from the first side face 3. Thus, the light pressure is generated in a direction perpendicular to the lower surface 6, that is, downward in a vertical direction parallel to the central axis O of rotation when the light is exit from the lower surface. Considering the direction parallel to the central axis O of rotation, the light pressure downward in the vertical direction opposite the Fs, which is upward in the vertical direction, is generated at the blade 28 of the light pressure rotator 26, but the light pressure trap force that pushes down the light pressure rotator 26 downward acts as a whole. Therefore, when the light is parallel irradiated from above parallel to the central axis O of rotation, the light pressure trap force pushing down the light pressure rotator 26 downward and the rotary torque Ft are mainly acted thereon, whereby the light pressure rotator 26 is light pressure rotated in the clockwise direction, as shown with an arrow in FIG. 6, while being pushed downward.

The light pressure rotator 30 according to a fifth embodiment of the present invention will now be described based on FIG. 8. The light pressure rotator 30 differs from the light pressure rotator 26 of the fourth embodiment in that a planar light pressure generating inclined surface 27 is provided in the light pressure rotator 26, whereas the light pressure generating curved surface 31 curved downward is provided in the light pressure rotator 30.

The light pressure generating curved surface 31 is a curved surface formed so as to contact the first side face 3, the second side face 4, and the third side face 5, as shown in the figure. Specifically, the light pressure generating curved surface is formed to a curved surface shape so that the angle formed by the radial direction passing through the central axis O of rotation and the light pressure direction is a right angle at each point on the light pressure generating curved surface 31. Thus, the optical torque expressed by the inner product of the light pressure generated from the light pressure generating curved surface (light pressure generating inclined surface) 31 and the distance from the central axis O of rotation increases and the total amount of optical torque becomes a maximum, compared to the light pressure rotator 26 of the third embodiment in which the light pressure generating inclined surface 27 is formed into a plane, whereby the light pressure rotator 30 can be light pressure rotated faster than the light pressure rotator 26. The principle of operation of the light pressure rotator of when the light is parallel irradiated is the same as the light pressure rotator 26, and thus the description thereof will be omitted.

A light pressure rotator 34 according to a sixth embodiment of the present invention will now be described based on FIG. 9. The light pressure rotator 34 differs from the light pressure rotator 26 of the fourth embodiment in that the light pressure generating inclined surface 27 of the light pressure rotator 26 is inclined downward from the first side face 3 towards the lower surface 6 and directly connected to the lower surface 6 to become a planar light pressure generating inclined surface 35 since the third side face 5 is not arranged.

The principle of operation of the light pressure rotator 34 according to the present embodiment of when the light is parallel irradiated is the same as the principle of operation of the light pressure rotator 26 according to the fourth embodiment, and thus the description thereof will be omitted. Some of the light that has entered from the light pressure generating inclined surface 27 is reflected at the lower surface 6 subsequent to the first side face 3, and then exit from the third side face 5 in the light pressure rotator 26 shown in FIGS. 6 and 7. When the light is reflected at the first side face 3, the light pressure is generated in a direction perpendicular to the first side face 3, which generated light pressure acts as reverse torque since it is in the direction opposite the light pressure generated with respect to the light pressure generating inclined surface 27. In the light pressure rotator 34 according to the present embodiment, however, the generated amount of reverse torque is reduced by omitting the third side face 5 as mentioned above and reducing the area of generating the light pressure at the first side face 3 thus achieving high-speed light pressure rotation.

A light pressure rotator 38 according to a seventh embodiment of the present invention will now be described based on FIG. 10. The light pressure rotator 38 differs from the light pressure rotator 36 of the sixth embodiment in that the light pressure generating inclined surface 35 is not planar but is a light pressure generating curved surface 39 that is curved downward. The light pressure generating inclined surface is formed into a curved surface shape so that the angle formed by the radial direction passing through the central axis O of rotation and the light pressure direction is right angle or the total amount of optical torque is a maximum at each point on the light pressure generating curved surface 39. The reverse torque is not generated from the first side face 3 as in the light pressure rotator 26 since the third side face 5 is not arranged, and furthermore, faster light pressure rotation is achieved compared to the light pressure rotator 34 since the light pressure generating curved surface 39 is formed into a curved surface shape.

Figure 11:
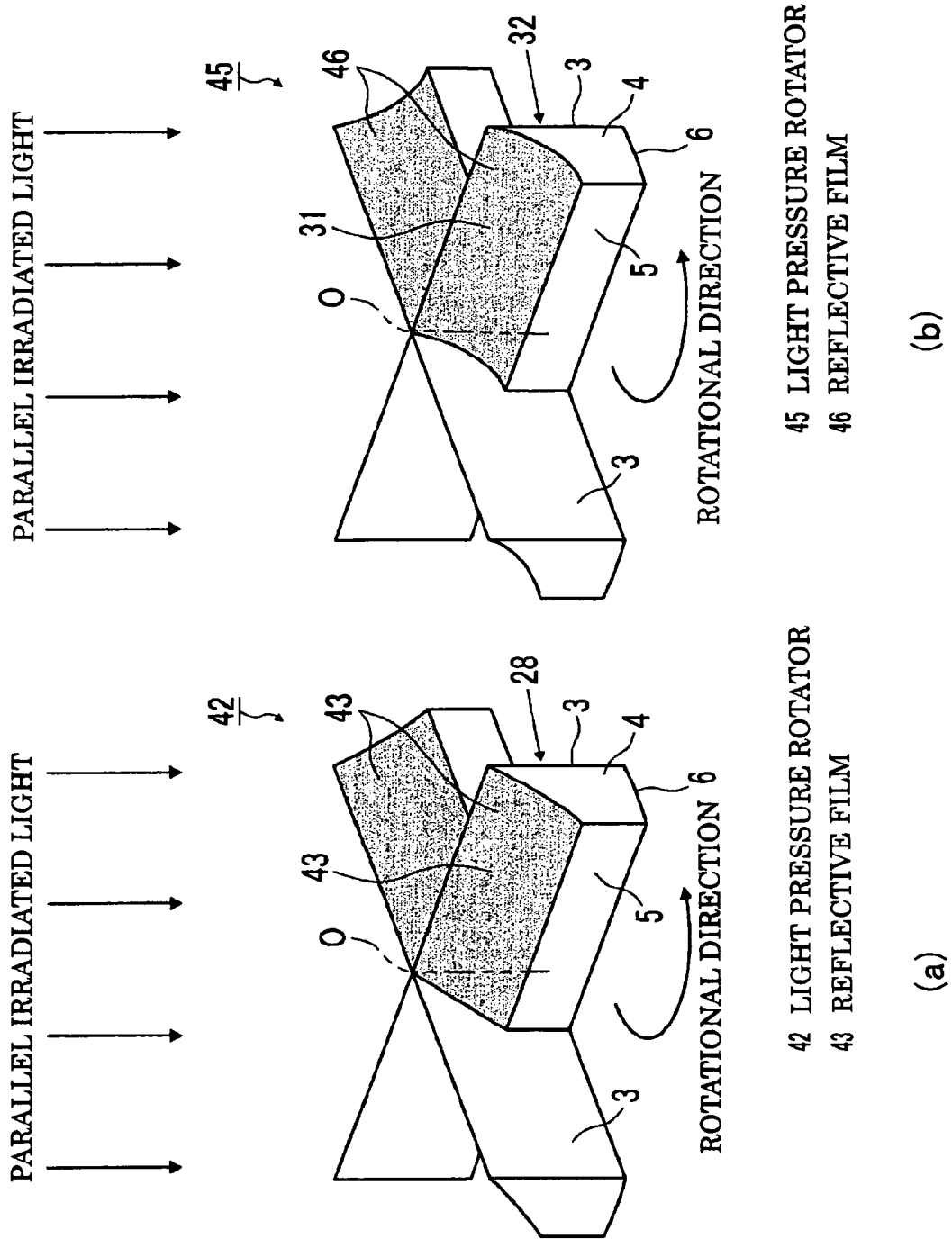
FIG. 11(a) is a perspective view of a light pressure rotator according to an eighth embodiment of the present invention.
FIG. 11(b) is a perspective view of a light pressure rotator according to a ninth embodiment of the present invention.

A light pressure rotator 42 according to an eighth embodiment of the present invention will now be described based on FIG. 11(a). The light pressure rotator 42 according to the present embodiment is a light pressure rotator 42 in which a reflective film 43 is attached to the light pressure generating inclined surface 27 in the light pressure rotator 26 according to the fourth embodiment shown in FIG. 6 so that the parallel irradiated light does not enter the light pressure rotator. Therefore, the reverse torque as shown in FIG. 7(a) is not generated. In other words, some of the light that has entered inside the light pressure rotator 26 is reflected at the first side face 3, reflected at the lower surface and then exit from the third side face 5, where the light pressure that becomes the reverse torque is generated in a direction perpendiculars to the first side face 3 when the light is reflected at the first side face 3. However, in the case of the light pressure rotator 42, the light is prevented from entering inside the light pressure rotator 42 by the reflective film 43 so that the light pressure that acts as the reverse torque is not generated from the first side face 3. In this case, all lights are reflected by the reflective film 43, and the light pressure is generated in the pushing direction, whereby the rotational direction becomes opposite to that in FIG. 7 of the fourth embodiment.

A light pressure rotator 45 according to a ninth embodiment of the present invention will now be described based on FIG. 11(b). The light pressure rotator 45 according to the present embodiment is a light pressure rotator in which a reflective film 46 is attached to the light pressure generating curved surface 31 in the light pressure rotator 30 according to the fifth embodiment of FIG. 8 so that the parallel irradiated light does not enter inside the light pressure rotator. Other configurations are exactly the same as the light pressure rotator 30.

Figure 8:
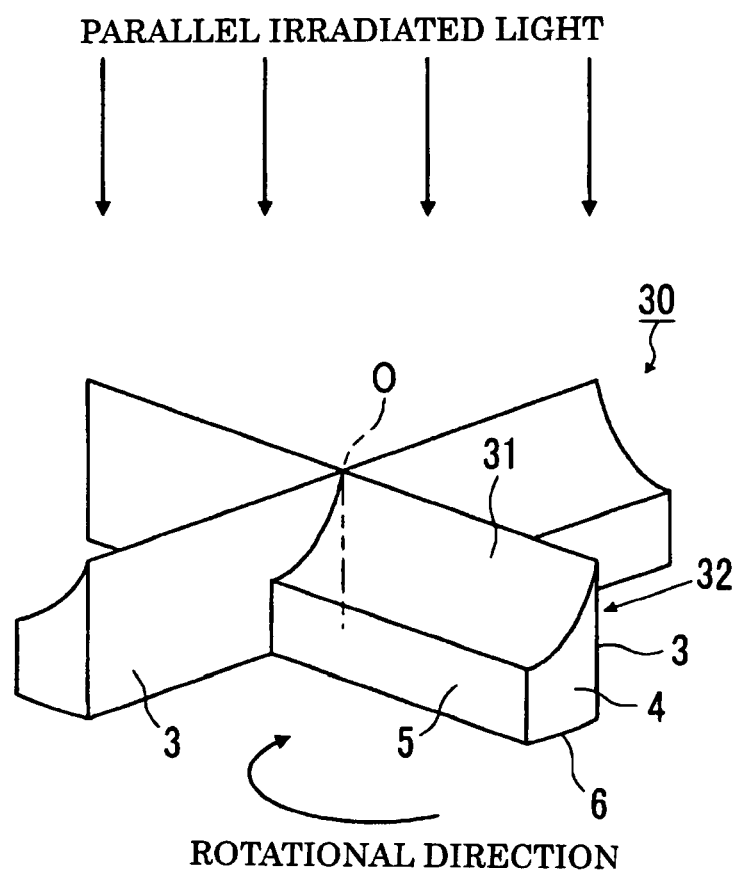
FIG. 8 is a perspective view of a light pressure rotator according to a fifth embodiment of the present invention.

In the light pressure rotator 30 according to the fifth embodiment, when the light is irradiated from above parallel to the central axis O of rotation, as shown in FIG. 8, the reverse torque is similarly generated from the first side face 3 as described in the eighth embodiment, whereas the light pressure that acts as the reverse torque is not generate from the first side face 3 in the light pressure rotator 45 of the present embodiment since the reflective film 46 is attached to the light pressure generating curved surface 31. In this case as well, all lights are reflected by the reflective film 43 and the light pressure is generated in the pushing direction, whereby the rotational direction becomes opposite to that in FIG. 8 of the fifth embodiment.

Figure 9:
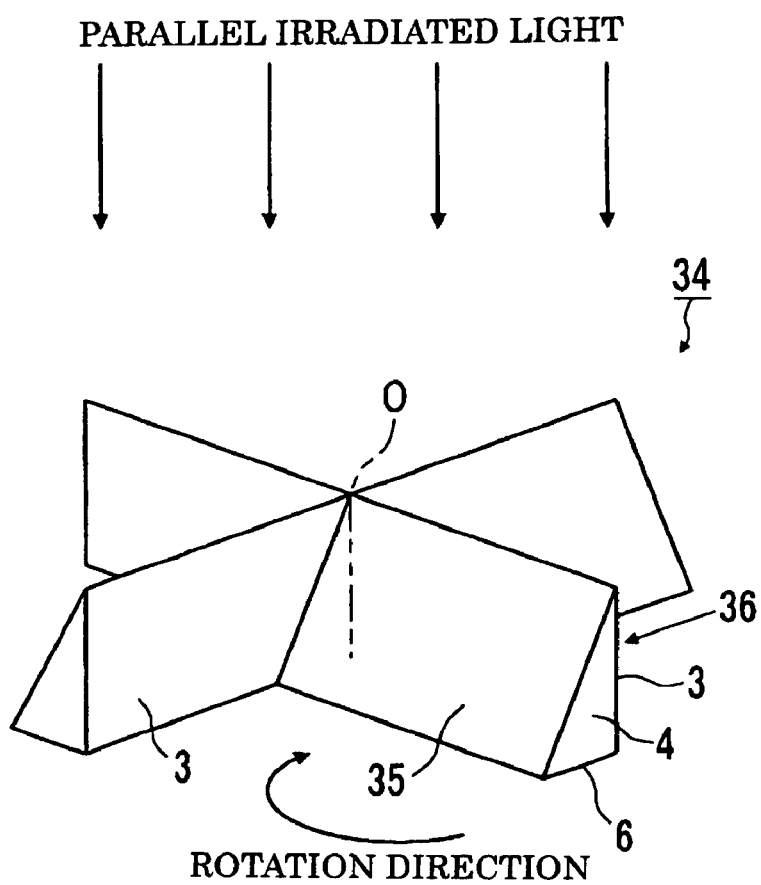
FIG. 9 is a perspective view of a light pressure rotator according to a sixth embodiment of the present invention.
Figure 10:
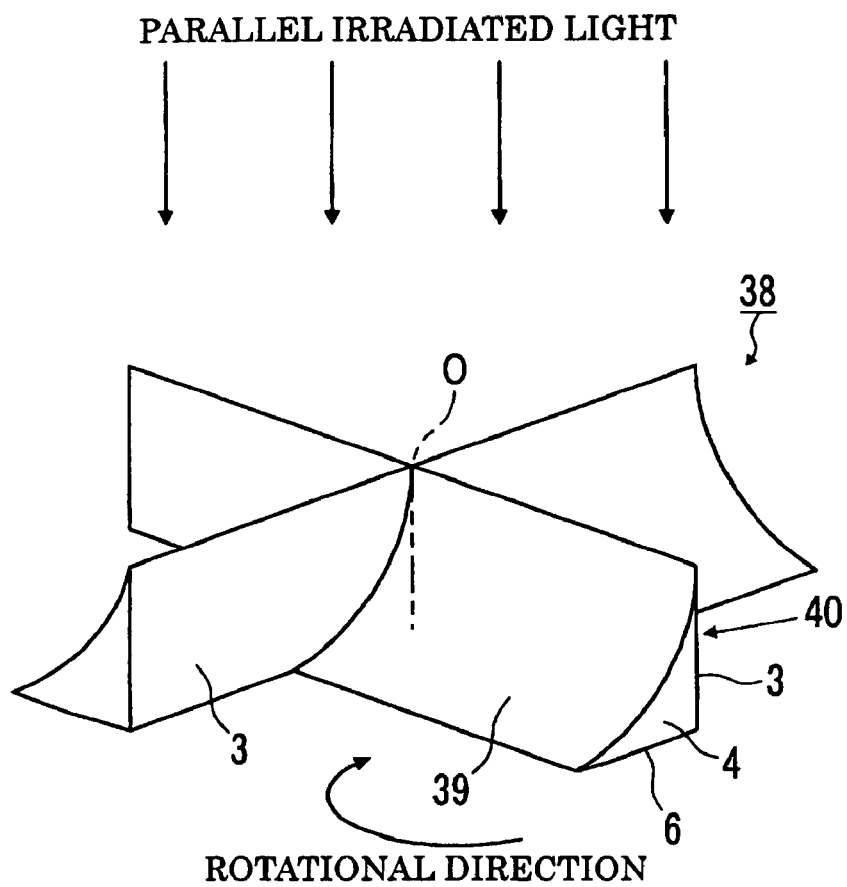
FIG. 10 is a perspective view of a light pressure rotator according to a seventh embodiment of the present invention.

Although not shown, the reflective film may be attached to the light pressure generating inclined surface 35 of the light pressure rotator 34 shown in FIG. 9, or the light pressure generating curved surface 39 of the light pressure rotator 38 shown in FIG. 10. In these cases, the reverse torque is prevented from generating from the first side face 3 similar to the light pressure rotator 42 and the light pressure rotator 45, and as a result, the light pressure rotator 34 and the light pressure rotator 38 can be light pressure rotated at higher speed.

The light pressure rotator provided with three blades or the light pressure rotator provided with four blades have been described in the second to the ninth embodiments, but the number of blades is not particularly limited. Although the light pressure F generated with respect to the light pressure rotator increases and greater rotary torque can be obtained with greater number of blades, the viscosity resistance from the surrounding medium with respect to the light pressure rotator adversely increases. Therefore, the number of blades of the light pressure rotator according to the second to the ninth embodiments should be determined in view of such points, and is suitably about "three" to "five" blades in all embodiments, although it depends on the dimension and the like of each part of the light pressure rotator.

A light pressure rotator 48 according to a tenth embodiment of the present invention will now be described based on FIG. 12. The light pressure rotator 48 according to the present embodiment is a light pressure rotator being light pressure trapped by irradiation with light and light pressure rotated about the central axis O of rotation, and having four stirring paddles 49 arranged in the radial direction from the central axis O of rotation of the main body of the light pressure rotator 48, and a plurality of light pressure generating inclined surfaces 50 crossing each other at the central axis O of rotation formed at the upper surface or the lower surface of the main body of the light pressure rotator 48.

Figure 6:
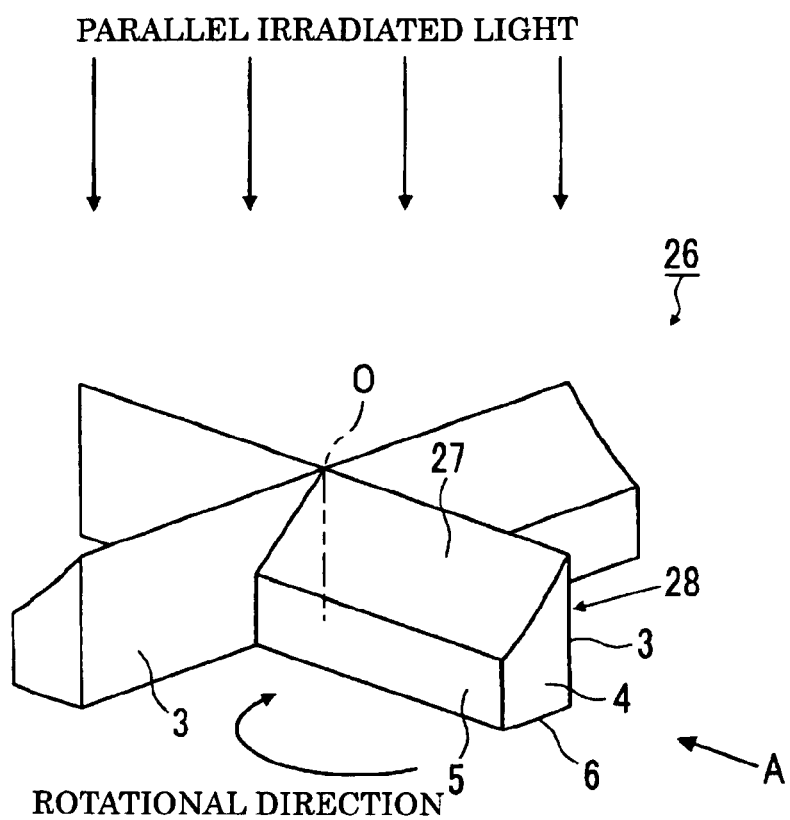
FIG. 6 is a perspective view of a light pressure rotator according to a fourth embodiment of the present invention.
Figure 7:
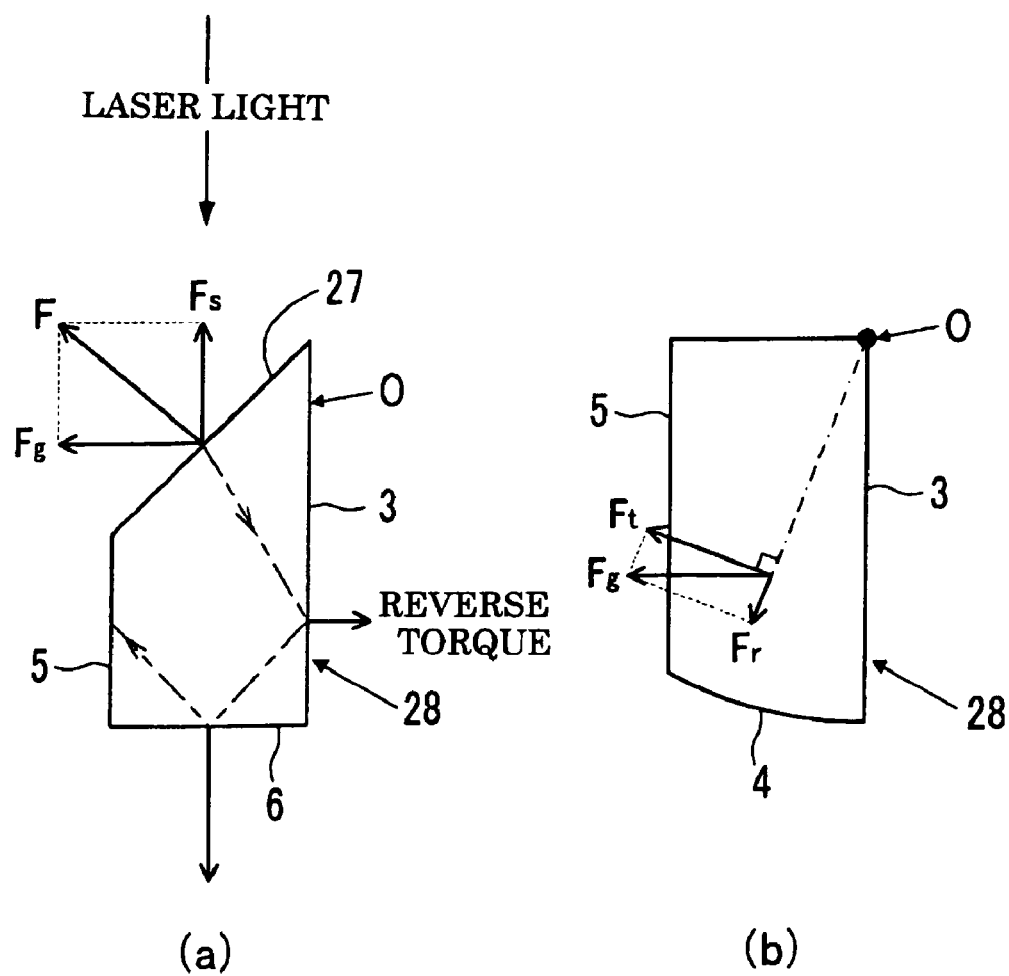
FIG. 7(a) is a front view of a blade seen from the direction of the arrow in Fig. A.
FIG. 7(b) is a plan view of the blade seen from above in the direction parallel to the central axis of rotation.

The light pressure generating inclined surface 50 of the light pressure rotator 48 is formed on the upper surface or the lower surface of the main body of the light pressure rotator 48 and not on the stirring paddle 49 comparable to the blade of the above description in the present embodiment, but the principle of operation in that the light pressure is generated at the light pressure generating inclined surface 50 and the light pressure rotator 48 is light pressure trapped is the same as that of the light pressure rotator 26 and the like described based on FIGS. 6 and 7, and thus the description on the principle of operation of the light pressure rotator 48 will be omitted.

The difference between the light pressure rotator 48 and the light pressure rotator of the other embodiments is that light pressure rotation is achieved without forming the light pressure generating inclined surface on the stirring paddle (blade) 49 since the light pressure generating inclined surface 50 is formed on the upper surface or the lower surface or on both surfaces of the main body of the light pressure rotator 48. That is, the shape of the stirring paddle 49 can be arbitrarily designed without taking the optical torque generated by irradiation of light into consideration.

Thus, the light pressure rotator 48 according to the tenth embodiment of the present invention can be light pressure rotated by parallel irradiated light, can more efficiently stir and mix the micro-fluid when used at the mixing section 15 of the integrated chemical analysis equipment 12 of FIG. 4 and can simplify the device configuration of the integrated chemical analysis equipment 12 since the objective lens 9 and the like is unnecessary. The micro-fluid is efficiently stirred and mixed by designing the shape of the stirring paddle 49 to a most efficient stirring shape.

Figure 12:
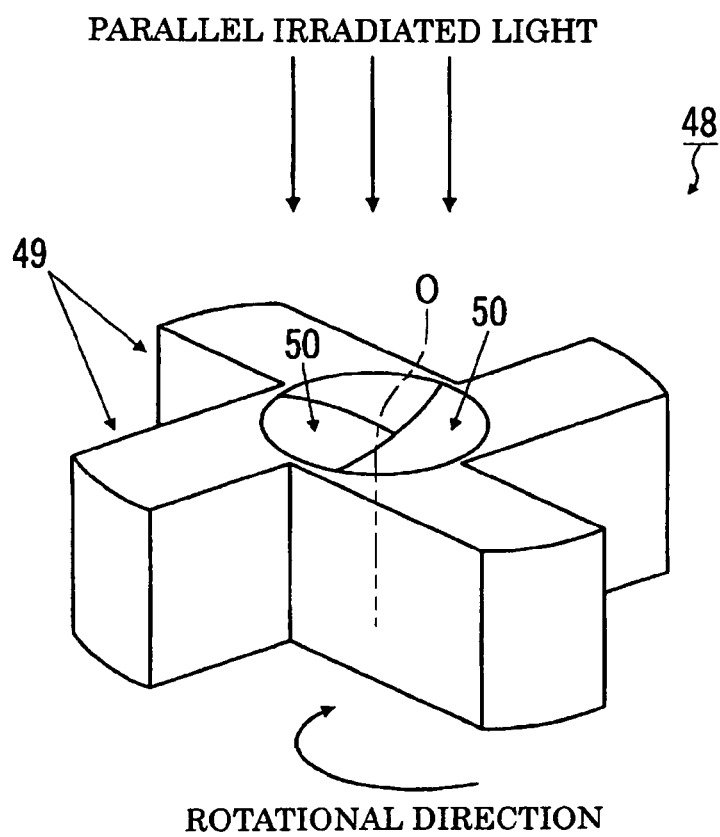
FIG. 12 is a perspective view of a light pressure rotator according to a tenth embodiment of the present invention.

The light pressure rotator 48 that is light pressure rotated by the parallel irradiated light is shown in FIG. 12, but the light pressure rotator 48 may also be light pressure rotated by the condensing irradiated light. That is, light pressure rotation using both the light pressure generated in a direction perpendicular to the light pressure generating inclined surface 50 and the light pressure (light pressure corresponding to light pressure $F_b$ described in the first embodiment) generated with respect to the side face of one part of the stirring paddle 49 by the light entered from the light pressure generating inclined surface 50 into the light pressure rotator 48 as the optical torque is possible. The light pressure rotator 48 shown in the figure is arranged with four stirring paddles 49, and formed with two light pressure generating inclined surfaces 50 on the upper surface of the light pressure rotator 48 main body, but the number of stirring paddles 49 and the number of light pressure generating inclined surfaces 50 are not limited thereto, and the number of stirring paddles may be two, three, five etc., and the number of light pressure generating inclined surfaces 50 may be three etc.

The light pressure rotator 48 shown in FIG. 12 has two light pressure generating inclined surfaces 50 formed on the upper surface so as to be directed towards each other, and is light pressure rotated by parallel irradiating the light from above along the central axis O of rotation, but may have the light pressure generating inclined surface 50 also formed on the lower surface of the main body to generate the light pressure rotation force in the same direction, so that the light pressure rotator 48 is light pressure rotated at higher speed by parallel irradiating the light from both above and below the light pressure rotator 48. The side face corresponding to the third side face 5 of the first embodiment may be formed on the stirring paddle 49 of the light pressure rotator 48, and the light pressure rotator 48 may be light pressure rotated by parallel irradiating the light from above the light pressure rotator 48 and condensing irradiating the light from below the light pressure rotator 48, in which case the light pressure rotator 48 is also light pressure rotated at high speed. If the light pressure generating inclined surfaces 50 which rotational direction is opposite to each other are formed on the upper surface and the lower surface of the main body of the light pressure rotator, the light pressure rotating device that can rotate the light pressure rotator 49 in both forward and reverse direction by switching the irradiation of light is obtained.

The configurations of the light pressure rotators shown in first to tenth embodiments are merely one aspect of the light pressure rotator according to the present invention, and may obviously be appropriately designed and modified within the scope not deviating from the concept of the present invention.

A method of manufacturing the light pressure rotator may be a semiconductor process using $SiO_2$ as the raw material, a photolithography method using various resists as the raw material, and a light modeling method using various resins as the raw material. In both the semiconductor process and the photolithography method, the shape mask of the light pressure rotator is exposed and transferred by ion beam or ultraviolet ray, and are suitable for producing the two dimensional shape all at once. In the light modeling method, the light pressure rotator of a complex three dimensional shape can be manufactured, but has a drawback in that it takes time since the light pressure rotator is manufactured one at a time through scanning of laser beam.

A method of manufacturing using a mold and through pressing/injection molding of the present example has an advantage in that the light pressure rotator of a complex three dimensional shape can be mass produced. The operation thereof is broadly divided into (i) manufacturing of mold, and (ii) injection molding.

(i) Electric discharging and the like that enables high precision processing of micron order is used in manufacturing the mold (not only metal, but silicon and quartz are also used) of the light pressure rotator according to any one of claims 1 to 9. The electric discharging is particularly suited for complex processing, and has high degree of accuracy since stress is not applied to the tool or the processing object.

(ii) (a) Thermoplastic resin of PC, PMMA etc. and (b) ultraviolet curable resin are molded with a method of pressing or injection etc. Specifically, in (a), the raw material is pressured in the heated state or the thick liquid resin is injected, cooled, and cured at high speed into the mold in the heating cylinder, and in (b), the light curable resin of low viscosity is deformed with the mold, and thereafter, irradiated with ultraviolet and cured, and then the mold is released. These micro-fabrication methods are effectively used in manufacturing the light pressure rotator of the present invention as a nano in-print technique having a pattern resolution of 10 nm.

The light to be irradiated onto the light pressure rotator may be natural light (solar light), laser light, SR light, light emitted from mercury lamp, or light emitted from artificial light source such as light of electric lamp. The light obtained by processing the natural light by passing it through prism, filter, slit and the like is herein assumed as light from an artificial light source for the sake of convenience. SR light or laser light is preferable to use since the condensing property is satisfactory as the wavelengths are lined, and the energy per unit area is high. In particular, the laser light source (laser emitter) for emitting the laser light is one of the most preferred since the there are various types such as those that are relatively easy to acquire, inexpensive, and small.

The medium present around the light pressure rotator is fluid such as liquid, gas, and other fluids, and may also be air in the atmosphere, and thus is not particularly limited if the density is thin, but the rotation of the light pressure rotator is not possible if the density and viscosity is extremely large in the case of liquid, fluid and the like. The limiting point is still not defined, and cannot be completely defined since it is influenced by the type of light emitted from the artificial light source, size and shape of the light pressure rotator, amount of irradiation of light, type of attached tool etc. For example, the rotation of the light pressure rotator of the first example is satisfactorily performed even if the medium is liquid (viscosity is 1.9 times pure water) of high viscosity obtained by adding 20% glycerin to pure water. Furthermore, the light pressure rotator rotates at 500 rpm at laser power of 200 mW in the medium obtained by adding 20% of milk fat colloid and 0.5% of interfacial active agent (soap water) to pure water.

The application of the light pressure rotator according to the present invention shown in the first to the tenth embodiments is extended by being used as the light pressure rotating device with the artificial light source such as laser light source (laser emitter), or with artificial light source and objective (condenser) lens. Light can be parallel irradiated to the light pressure rotator in the medium of fluid to rotate the light pressure rotator about the central axis of rotation according to the combination of the light pressure rotator and the artificial light source, where in such case, the objective lens may be arranged between the light pressure rotator and the artificial light source so as to freely move closer to or move away from the light pressure rotator, whereby the focus condensing position changes, and the light pressure rotator drawn closer to the vicinity of such focus condensing position by light pressure trapping moves in the two dimensional direction while being rotated about the central axis of rotation. When a configuration in which the objective lens can also move in the three dimensional direction with the artificial light source is adopted, the light pressure rotator follows and moves in the three dimensional direction while being rotated about the central axis of rotation. A device in which two or more artificial light sources or objective lens corresponds to one light pressure rotator may be provided, in which case, light can be irradiated from different directions and the light receiving amount increases, whereby the rotational force increases by such amount. An example of using such light pressure rotating device will now be described.

The light pressure rotator according to the invention shown in first to the tenth embodiments are all equipped with blades, where the use of the light pressure rotating device as the stirring equipment having stirring blades for stirring the plurality of micro-fluids in the integrated chemical analysis equipment by rotating the light pressure rotator about the central axis of rotation by the irradiation of light from the artificial light source is as described above.

Similarly, the light pressure rotator according to the present invention shown in the first to the tenth embodiments are all equipped with blades, and thus may configure the light pressure rotating device serving as a pump for accelerating the flow rate of the fluid, or for sending fluid one from the other by being rotated with the light from the artificial light source in the microscopic path where the fluid flows.

Figure 14:
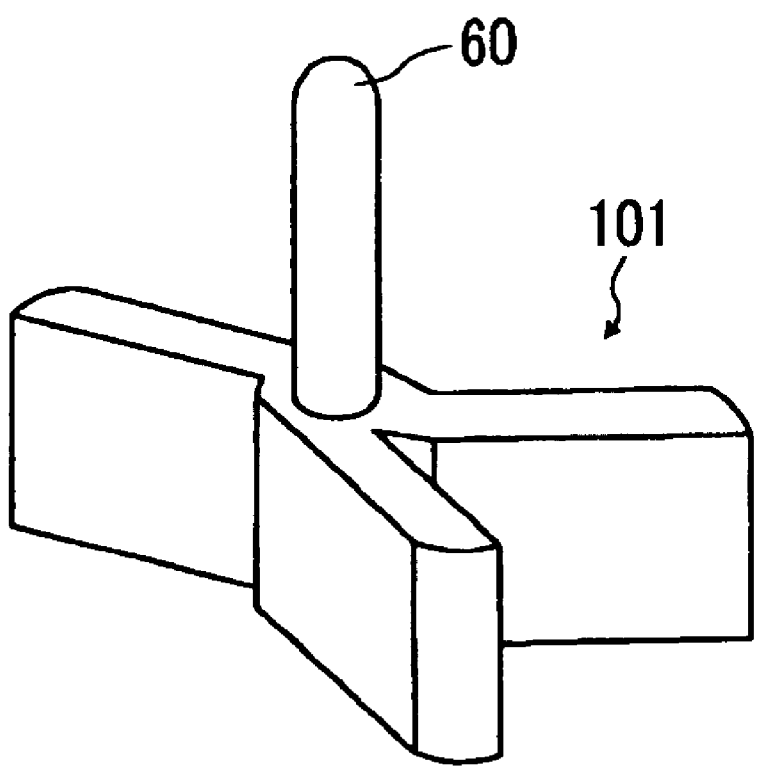
FIG. 14 is a perspective view with an attachment tool fixed on a central axis of rotation of the light pressure rotator.
Figure 15:
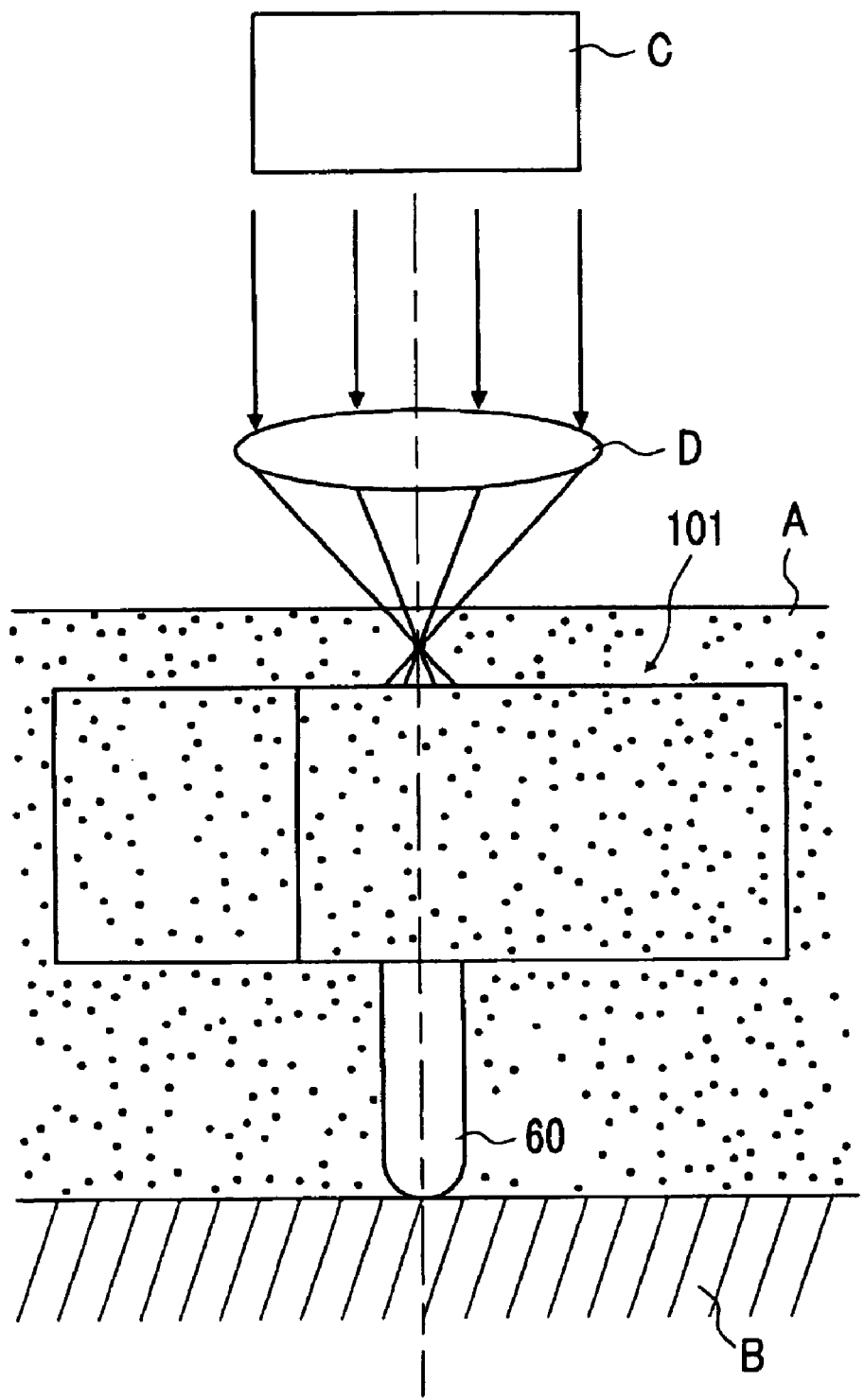
FIG. 15 is a perspective view showing the use of the light pressure rotator device using the light pressure rotator of FIG. 14.

An embodiment of the light pressure rotator device using the light pressure rotator according to the present invention shown in first to the tenth embodiments will now be described. Unless otherwise stated, the light pressure rotator of any of the described embodiments may be used, and thus is collectively designated as light pressure rotator 101. As shown in FIG. 14, an attachment tool 60 is arranged at the center of rotation of the main body of the light pressure rotator 101, and the device can be used in various applications using the attachment tool. For example, the attachment tool 60 is contacted to an object B in the medium A, and the light emitted from the artificial light source C such as laser light source (laser emitter) is condensed at the objective lens D and collected at a focus, and the light pressure rotator 101 is light pressure trapped and drawn closer and rotated in the vicinity thereof, as shown in FIG. 15. The objective lens D is brought close to the light pressure rotator 101 when pushing the attachment tool 60 against the object B. The application serving as the light pressure rotating device using the attachment tool 60 will now be described in the following embodiment.

Figure 16:
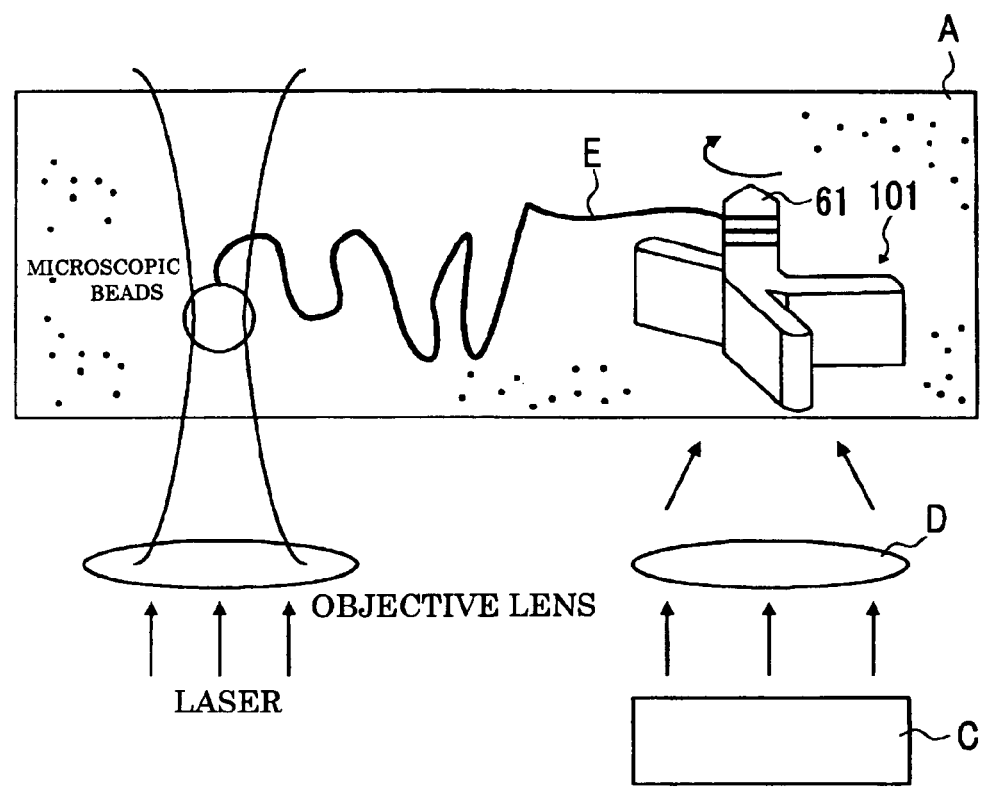
FIG. 16 is a perspective view showing the use of the light pressure rotator device in which the attachment tool is a take-up tool.

The light pressure rotating device shown in FIG. 16 uses a microscopic take-up unit for extending and taking up an ultra thin string (micro/nano-string) E such as DNA. In analyzing the genes, the target DNA must be sorted, and moved to a detection system and spread on the line with the intricately intertwined DNA unthreaded to read the base sequence. Conventionally, the laser light is condensed at the focus on the objective lens, and the DNA immobilized on the microscopic beads in the medium is pulled and extended by micro-pipette. However, since the DNA string is extremely long, the string of the extended DNA must be taken up, which was a technical problem since no appropriate method has been proposed. In the figure, the area surrounded by a line indicates the medium A such as liquid and a take-up rod 61 serving as the attachment tool 60 is fixed on one center of rotation of the light pressure rotator 101 in the medium, where when the light is emitted from the artificial light source C through the objective lens D to the other center of rotation, the light pressure rotator 101 is rotated based on the above described principle, and the string E of the DNA in the medium is taken up by the take-up rod 61.

Figure 17:
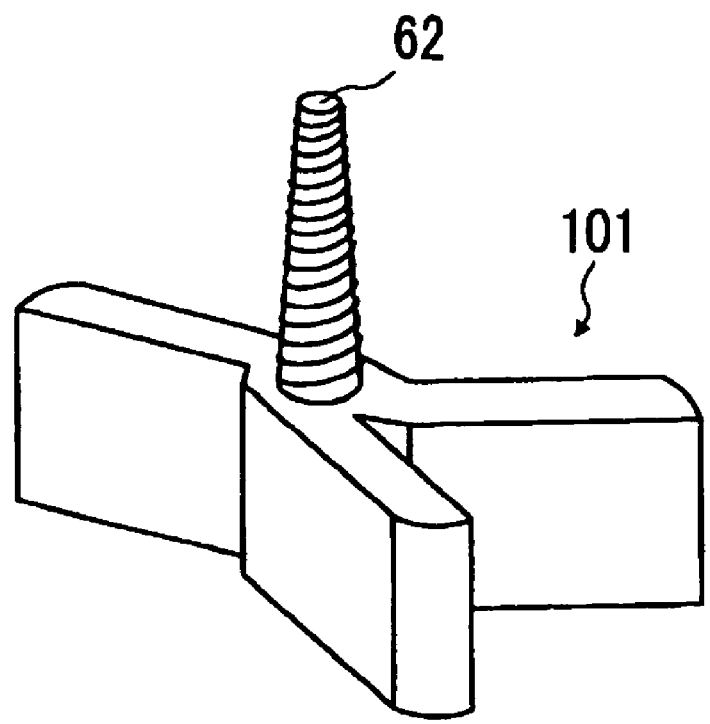
FIG. 17 is a perspective view of the light pressure rotator in which the attachment tool is a drill.

The light pressure rotator 101 used in the light pressure rotating device shown in FIG. 17 has a small drill 62 as the attachment tool 60. In this case, the device is used as a microdrill, and is assumed as a light pressure rotating device for bringing the focus condensing position closer to an object to be formed with a hole by the movement of the objective lens. The distal end of the small drill 62 is contacted to the object and pushed into the object while being rotated to open a hole.

Figure 18:
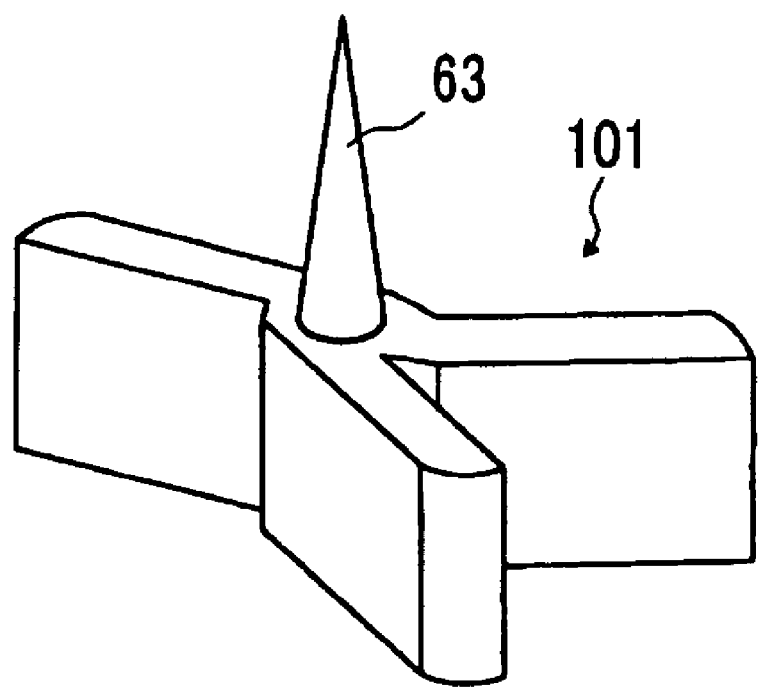
FIG. 18 is a perspective view of the light pressure rotator in which the attachment tool is a pointed object.

The light pressure rotator 101 used in the light pressure rotating device shown in FIG. 18 has a pointed object 63 as the attachment tool 60. In the case of such light pressure rotator device, applications such as piercing into the object to open a hole, moving while piercing therein to draw a line, piercing and then separating from the light pressure rotator 101 so as to be embedded in the object to form a projection etc. are possible.

Figure 19:
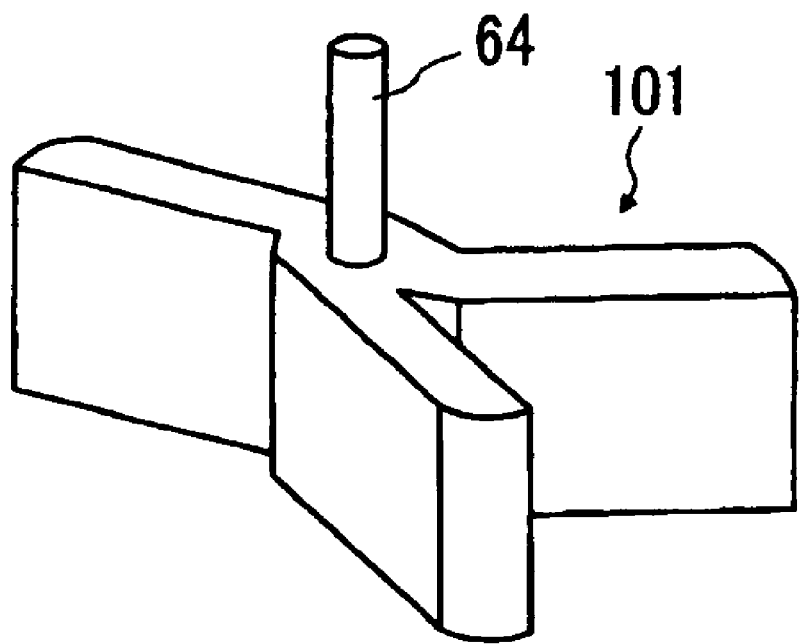
FIG. 19 is a perspective view of the light pressure rotator in which the attachment tool is a rotating shaft.
Figure 20:
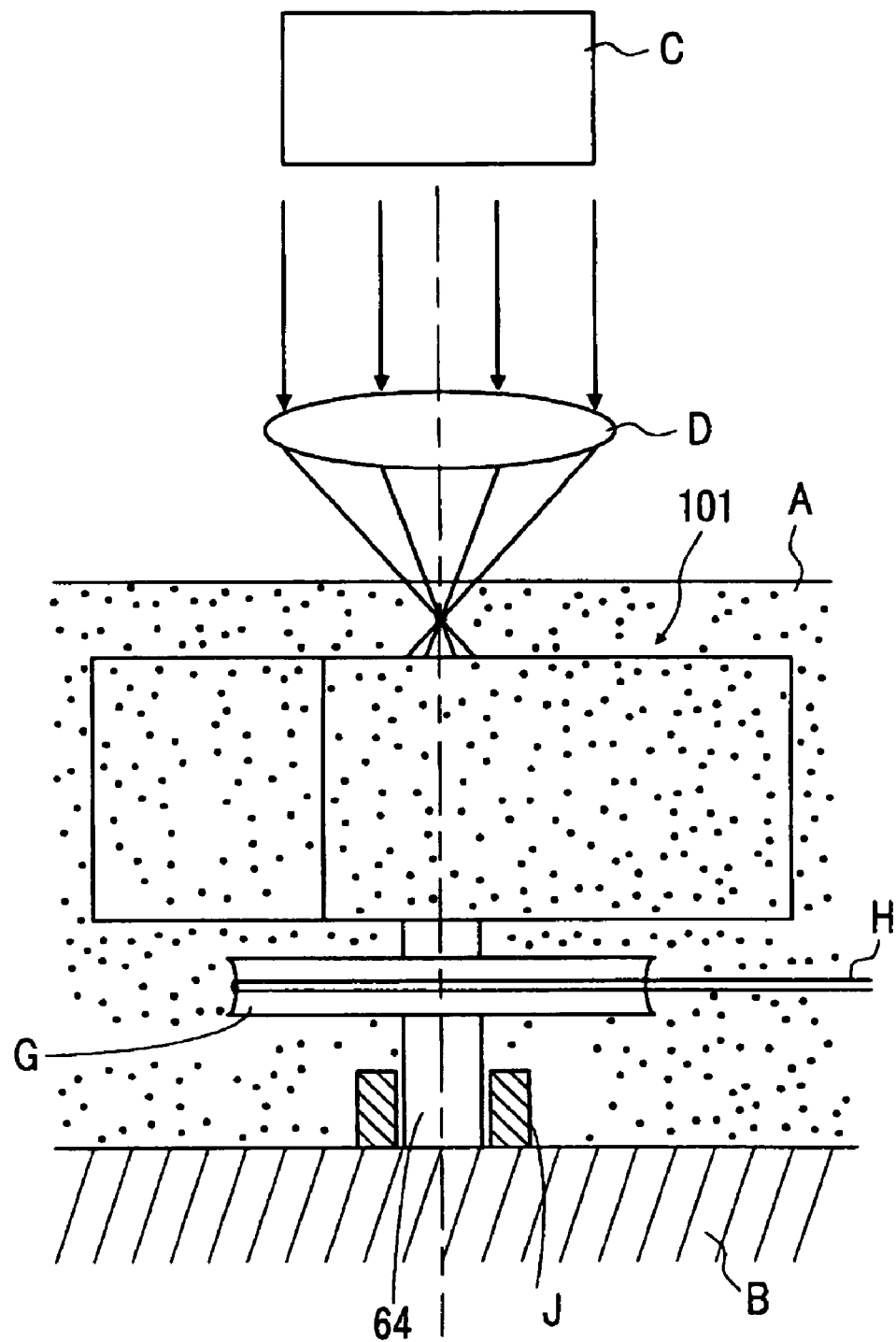
FIG. 20 is an explanatory view explaining the performance of the light pressure rotator device using the light pressure rotator of FIG. 19.

The light pressure rotator 101 used in the light pressure rotating device shown in FIG. 19 has a rotating shaft 64 as the attachment tool. In this case, the light pressure rotating device is used as a micro-motor. As shown in FIG. 20, a device in which a bearing J is arranged in the object B and the rotating shaft 64 is inserted in a freely rotating manner, so that rotation is retrieved from the belt H through a rotation transmitting wheel G attached to the rotating shaft 64 is obtained. The rotating shaft 64 may be arranged on both sides of the light pressure rotator 101 or may be modified in various ways. The rotation transmitting wheel may be a micro-wheel.

Figure 21:
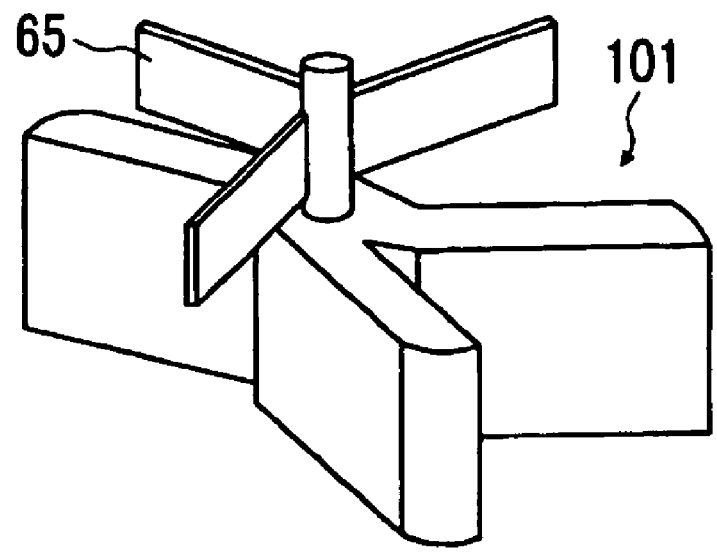
FIG. 21 is a perspective view of the light pressure rotator in which the attachment tool is a stirring blade.

The light pressure rotator 101 used in the light pressure rotating device shown in FIG. 21 has a rotating blade 65 as the attachment tool 60. In such case, stirring etc. is also possible with the rotating blade 65 in addition to the blades configuring the light pressure rotator 101, and thus the stirring efficiency etc. further enhances.

Figure 22:
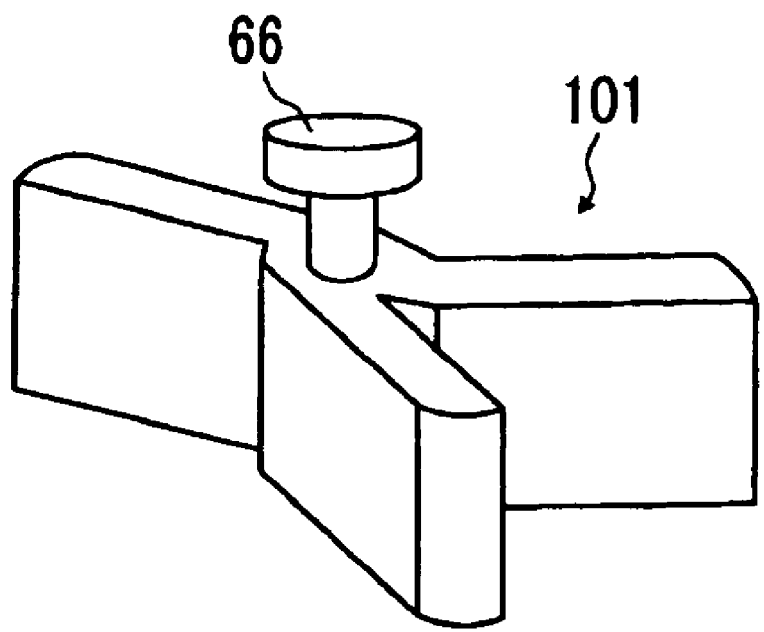
FIG. 22 is a perspective view of the light pressure rotator in which the attachment tool is a hammer.

The light pressure rotator 101 used in the light pressure rotating device shown in FIG. 22 has a hammer 66 as the attachment part 60. In this case as well, the light pressure trapped light pressure 01 can be struck onto the object by rapidly approaching the objective lens for condensing the laser light to the object to be struck. The object will not attach even if the surface is sticky since the light pressure rotator 101 is rotating, and thus can be repeatedly used over a number of times.

Figure 23:
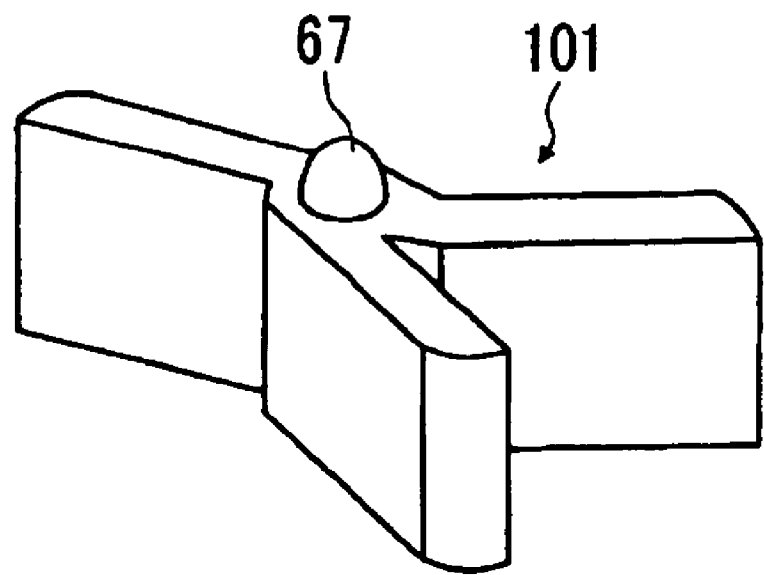
FIG. 23 is a perspective view of the light pressure rotator in which the attachment tool is a hemispherical object.

The light pressure rotator 101 used in the light pressure rotating device shown in FIG. 23 has a hemisphere 67 as the attachment tool 60. In this case, the light 101 is rotated with the apex of the hemisphere 67 pushed against the object so as to be used as the light pressure rotating device that satisfactorily rotates the light pressure rotator 101.

Figure 24:
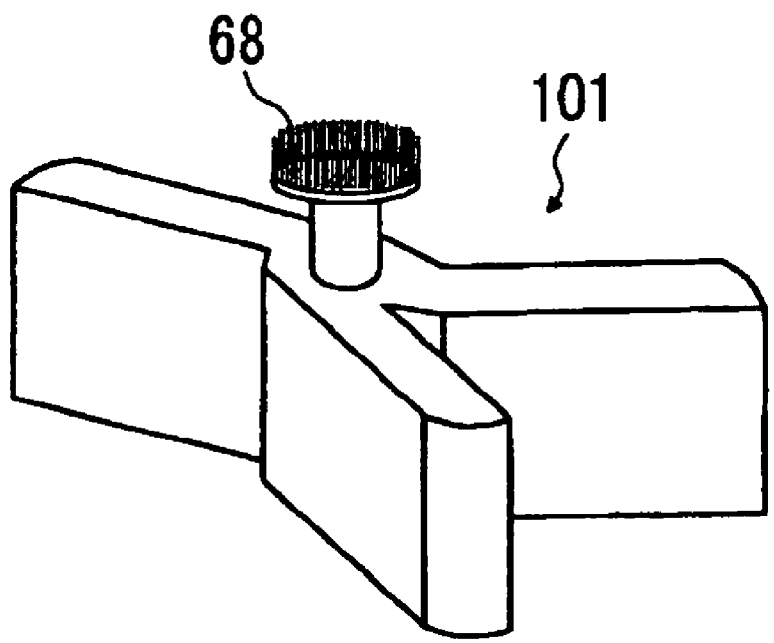
FIG. 24 is a perspective view of the light pressure rotator in which the attachment tool is a brush.

The light pressure rotator 101 used in the light pressure rotating device shown in FIG. 24 has a brush 68 as the attachment tool 60. In this case, the surface of the object is satisfactorily cleaned by approaching the objective lens in the direction of the object to be cleaned and rotating the same when the objective lens is used.

Figure 25:
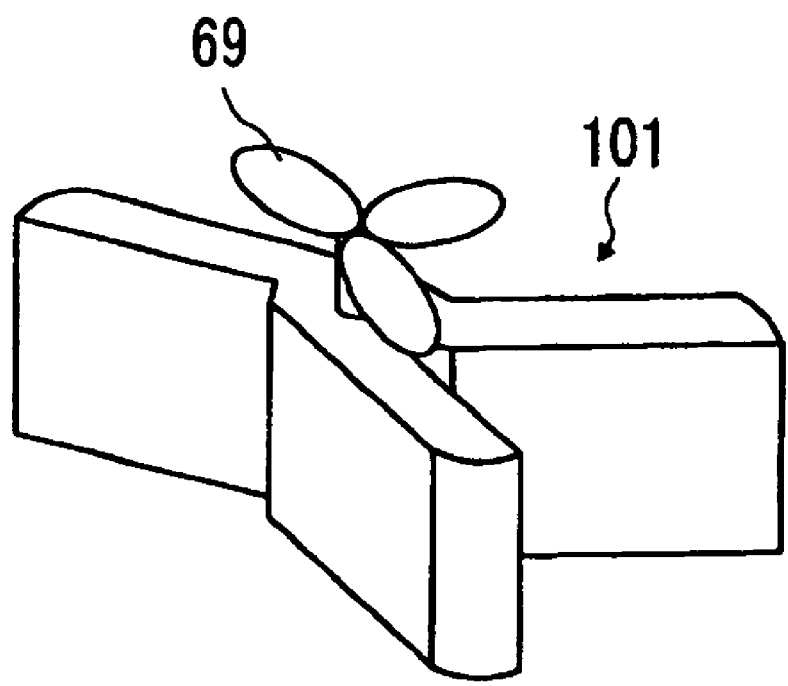
FIG. 25 is a perspective view of the light pressure rotator in which the attachment tool is a propeller.

The light pressure rotator 101 used in the light pressure rotating device shown in FIG. 25 has a propeller 69 used as the attachment tool 60. In this case, the light pressure rotator 101 has a function of the propelling machinery that advances forward in the direction of the central axis of rotation by the propulsive force of the propeller 69.

Figure 26:
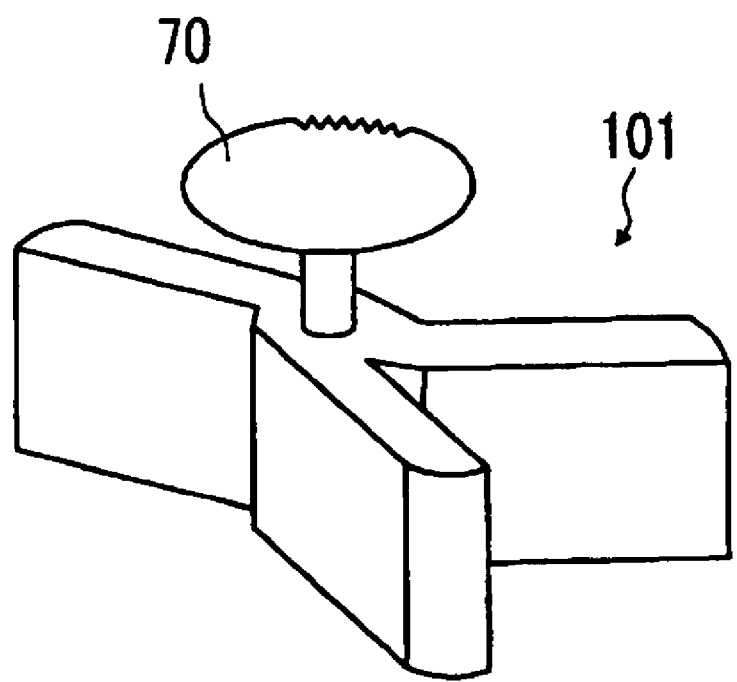
FIG. 26 is a perspective view of the light pressure rotator in which the attachment tool is a rotating blade.

The light pressure rotator 101 used in the light pressure rotating device shown in FIG. 26 has a rotating blade 70 as the attachment tool 60. In this case, if bumps are formed on the surface of the object, the bumps are effectively removed and formed into a flat state. Alternatively, the attachment tool acts as a cutter for cutting the thin plate material to a shape of desired size or cutting the three dimensional object to a desired shape. The rotating blade 70 may be of any type other than a saw shape.

Figure 27:
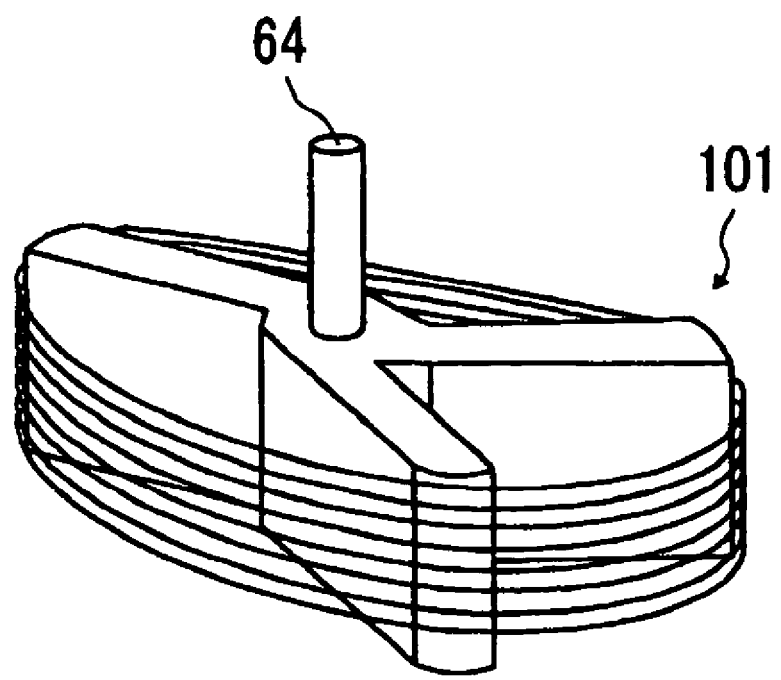
FIG. 27 is a perspective view showing a usage example of when the light pressure rotator itself is a take-up tool.

The light pressure rotator 101 used in the light pressure rotating device shown in FIG. 27 has the attachment tool itself as a take-up tool for an ultra thin string. In this case, the take-up rod 61 shown in FIG. 16 is unnecessary. In place thereof, the rotating shaft 64 may be arranged on the central axis of rotation to fix the center of rotation, and may be received at the bearing and rotated.

The above light pressure rotators 101 are usage examples, and other usage applications are encompassed in the scope of the present invention within the scope of the light pressure rotator and the light pressure rotating device of the present invention.

INDUSTRIAL APPLICABILITY

The present invention is effectively applied to various micro-tools and driving sources as described above since the light pressure rotator is microscopic.

The invention claimed is:

1. A light pressure rotator suitable for being light pressure trapped by irradiation with light and light pressure rotated when applied with a torque to rotate in a predetermined direction about a central axis of rotation, the light pressure rotator comprising:
   three blades, wherein a reverse torque generating section generating a torque for rotating the light pressure rotator in the direction reverse to the predetermined direction is removed from a section arranged with the three blades each having a first side face extending in the radial direction from the central axis of rotation, a second side face facing the central axis of rotation, a third side face facing the first side face, a lower surface intersecting the central axis of rotation, and an upper surface facing the lower surface, wherein the third side face is not perpendicular to the first side face of the adjacent blade, wherein the removed section forms a surface perpendicular to the first side face of the adjacent blade at the third side face.

2. The light pressure rotator according to claim 1, characterized in that the material of the light pressure rotator is dielectric material, PMMA or resist having light transmissivity.

3. The light pressure rotator according to claim 1, characterized in that the light pressure rotator is formed through pressing or injecting molding using a mold.

4. A light pressure rotating device characterized by comprising the light pressure rotator according to claim 1, and an artificial light source for irradiating light to the light pressure rotator.

5. The light pressure rotating device according to claim 4, characterized in that an objective lens is interposed between the artificial light source and the light pressure rotator, and the light from the artificial light source is condensed and irradiated to a predetermined focal position to move the light pressure rotator to the vicinity of the focal position and rotatably drive the light pressure rotator at the moved position.

6. The light pressure rotating device according to claim 5, characterized in that the objective lens freely moves closer to or moves away with respect to the artificial light source.

7. The light pressure rotating device according to claim 4, characterized in that the artificial light source and the objective lens are freely movable in the three dimensional direction.

8. The light pressuring rotating device according to claim 4, characterized in that the artificial light source is a laser light source.

9. The light pressuring rotating device according to claim 4, characterized in that an attachment tool is arranged on the central axis of rotation of the main body of the light pressure rotator.

10. The light pressure rotating device according to claim 9, characterized in that the attachment tool is a take-up tool for an ultra thin string.

11. A light pressure rotating device comprising an artificial light source and a light pressure rotator rotated by the light from the artificial light source,
   wherein the light pressure rotating device is a take-up tool for taking up the ultra thin string around the light pressure rotator;
   the light pressure rotator comprises three blades, each blades having a first side face extending in the radial direction from the central axis of rotation, a second side face facing the central axis of rotation, a third side face facing the first side face, a lower surface intersecting the central axis of rotation, and an upper surface facing the lower surface; and
   a reverse torque generating section is removed from each of the three blades, wherein the third side face is not perpendicular to the first side face of the adjacent blade, wherein the removed section forms a surface perpendicular to the first side face of the adjacent blade at the third side face of each of the three blades.

* * * * *